United States Patent

Shirakawa et al.

[11] Patent Number: 5,804,749
[45] Date of Patent: Sep. 8, 1998

[54] SOUND SOURCE CHIP HAVING VARIABLE CLOCK TO OPTIMIZE EXTERNAL MEMORY ACCESS

[75] Inventors: Tokio Shirakawa; Masaki Kudo; Shizuhiko Kawai, all of Hamamatsu, Japan

[73] Assignee: Yamaha Corporation, Hamamatsu, Japan

[21] Appl. No.: 773,200

[22] Filed: Dec. 24, 1996

[30] Foreign Application Priority Data

Dec. 28, 1995 [JP] Japan ..................................... 7-353235
Dec. 28, 1995 [JP] Japan ..................................... 7-353236

[51] Int. Cl.$^6$ .............................. G10H 7/00; G11C 7/00; H03M 7/00
[52] U.S. Cl. .............................................................. 84/601
[58] Field of Search ............................. 84/600–602, 615, 84/622, 659

[56] References Cited

U.S. PATENT DOCUMENTS

| | | |
|---|---|---|
| 4,386,401 | 5/1983 | O'Brien . |
| 4,805,508 | 2/1989 | Isozaki ..................................... 84/604 |
| 5,200,564 | 4/1993 | Usami et al. ............................. 84/602 |
| 5,342,990 | 8/1994 | Rossum ..................................... 84/603 |
| 5,469,561 | 11/1995 | Takeda . |
| 5,489,746 | 2/1996 | Suzuki et al. ............................. 84/602 |

FOREIGN PATENT DOCUMENTS 4-60598  2/1992  Japan .
5-188952 7/1993  Japan .

Primary Examiner—William M. Shoop, Jr.
Assistant Examiner—Jeffrey W. Donels
Attorney, Agent, or Firm—Graham & James

[57] ABSTRACT

In a sound source apparatus, a central processing unit is integrated in a semiconductor chip and operates in response to a primary operating clock signal for creating a control message. A tone generating unit is integrated in the same semiconductor chip and operates in response to a secondary operating clock signal for generating a musical tone according to the control message. A master clock generator generates a master clock signal having a desired frequency selected from a plurality of frequencies. A mode changer designates one of a first mode and a second mode corresponding to different operating speeds. A clock generator is provided for variably frequency-dividing the master clock signal to generate the primary operating clock signal and the secondary operating clock signal. The clock generator is responsive to the mode changer for changing a frequency ratio of the primary operating clock signal to the secondary operating clock signal between the first mode and the second mode. An external memory is provided separately from the semiconductor chip for storing information required for generation of the musical tone. A memory controller is provided for allotting a primary time slot to the central processing unit and a secondary time slot to the tone generating unit such as to optimize access to the external memory shared by the central processing unit and the tone generating unit. A cache memory is provided to speed up operation of the central processing unit.

27 Claims, 10 Drawing Sheets

FIG. 4A

| | |
|---|---|
| WAVEFORM DATA | ← 403 |
| AUTOMATIC PLAY DATA | ← 404 |
| TIMBRE CONTROL DATA | ← 405 |
| CPU PROGRAM | ← 406 |
| INTERNAL RAM | |

401 (upper portion) / 402 (INTERNAL RAM)

FIG. 4B

| | POWER SUPPLY VOLTAGE (V) | SX | MASTER CLOCK FREQUENCY (Hz) | NOMINAL OPERATING FREQUENCY OF CPU (Hz) | EFFECTIVE OPERATING FREQUENCY OF CPU (Hz) | Fs (Hz) |
|---|---|---|---|---|---|---|
| (1) | 5.0 | 0 | 32M | 8M | 6M | 31.25k |
| (2) | 5.0 | 0 | 28M | 7M | 5.25M | 27.34k |
| (3) | 5.0 | 0 | 24M | 6M | 4.5M | 23.43k |
| (4) | 5.0 | 0 | 20M | 5M | 3.75M | 19.53k** |
| (5) | 5.0 | 1 | 32M | 8M | 4M | 62.5k** |
| (6) | 5.0 | 1 | 28M | 7M | 3.5M | 54.69k |
| (7) | 5.0 | 1 | 24M | 6M | 3M | 46.88k |
| (8) | 5.0 | 1 | 20M | 5M | 2.5M | 39.06k |
| (9) | 3.3 | 0 | 24M | 6M | 4.5M | 23.44k |
| (10) | 3.3 | 0 | 22M | 5.5M | 4.125M | 21.48k** |
| (11) | 3.3 | 0 | 20M | 5M | 3.75M | 19.35k** |
| (12) | 3.3 | 0 | 18M | 4.5M | 3.375M | 17.58k** |
| (13) | 3.3 | 1 | 24M | 6M | 3M | 46.88k |
| (14) | 3.3 | 1 | 22M | 5.5M | 2.75M | 42.96k |
| (15) | 3.3 | 1 | 20M | 5M | 2.5M | 39.06k |
| (16) | 3.3 | 1 | 18M | 4.5M | 2.25M | 35.15k |

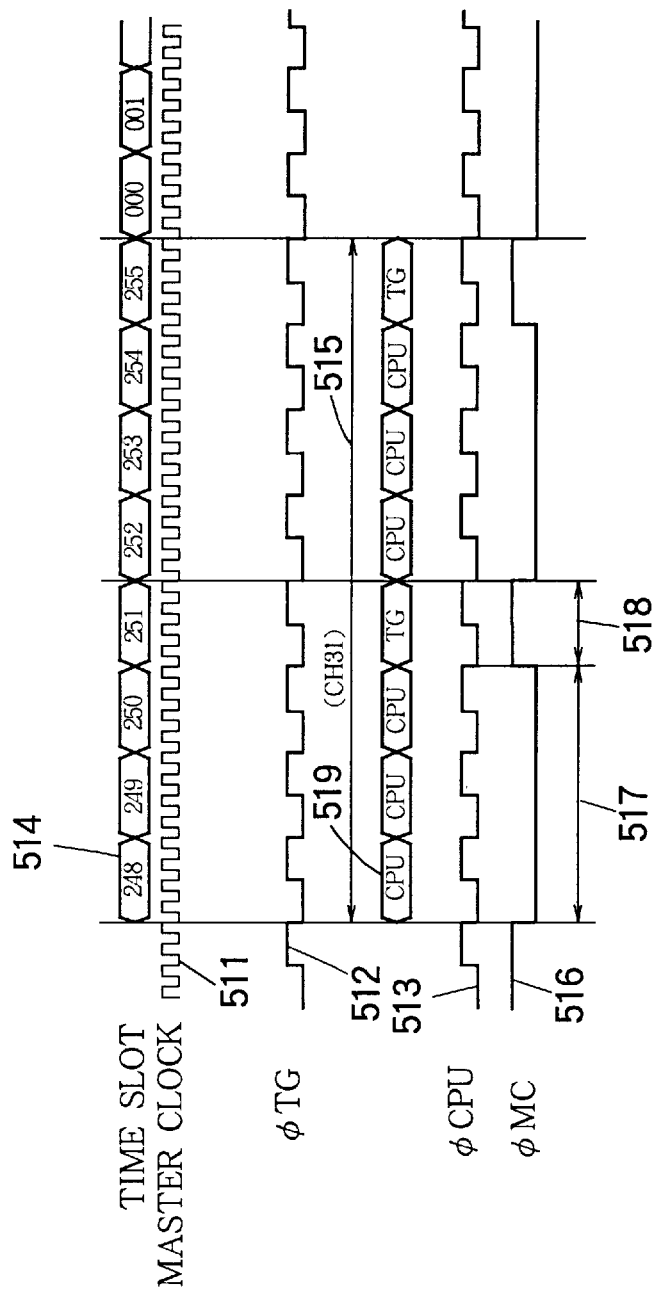

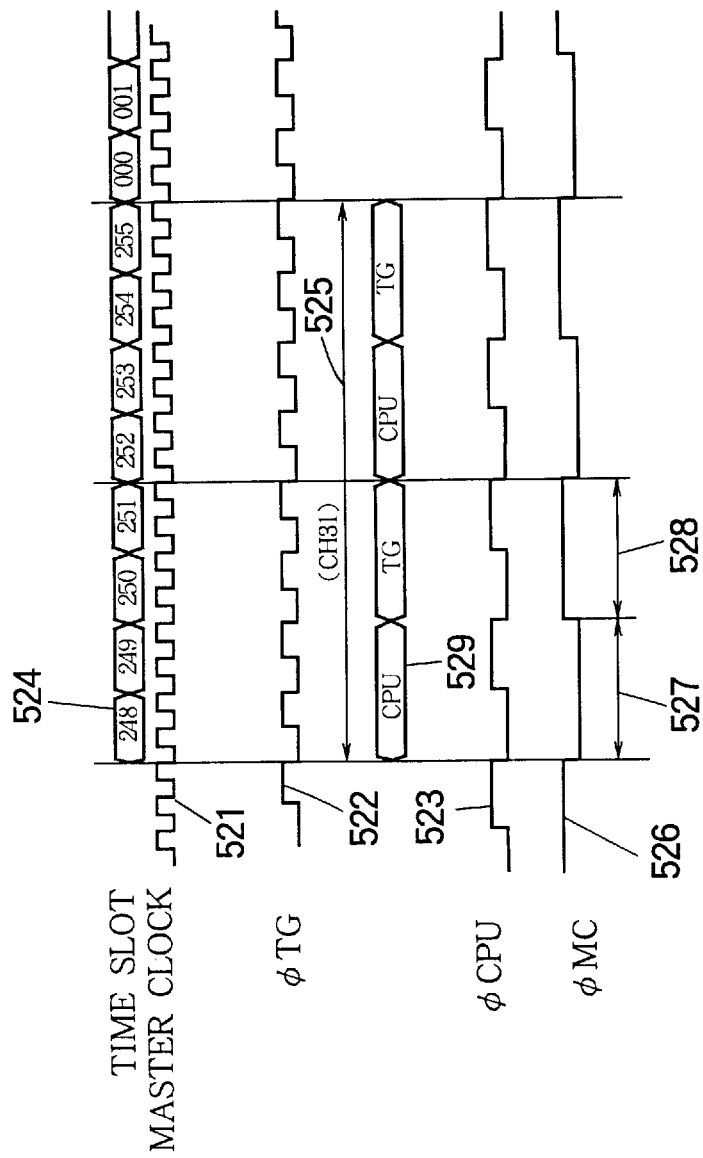

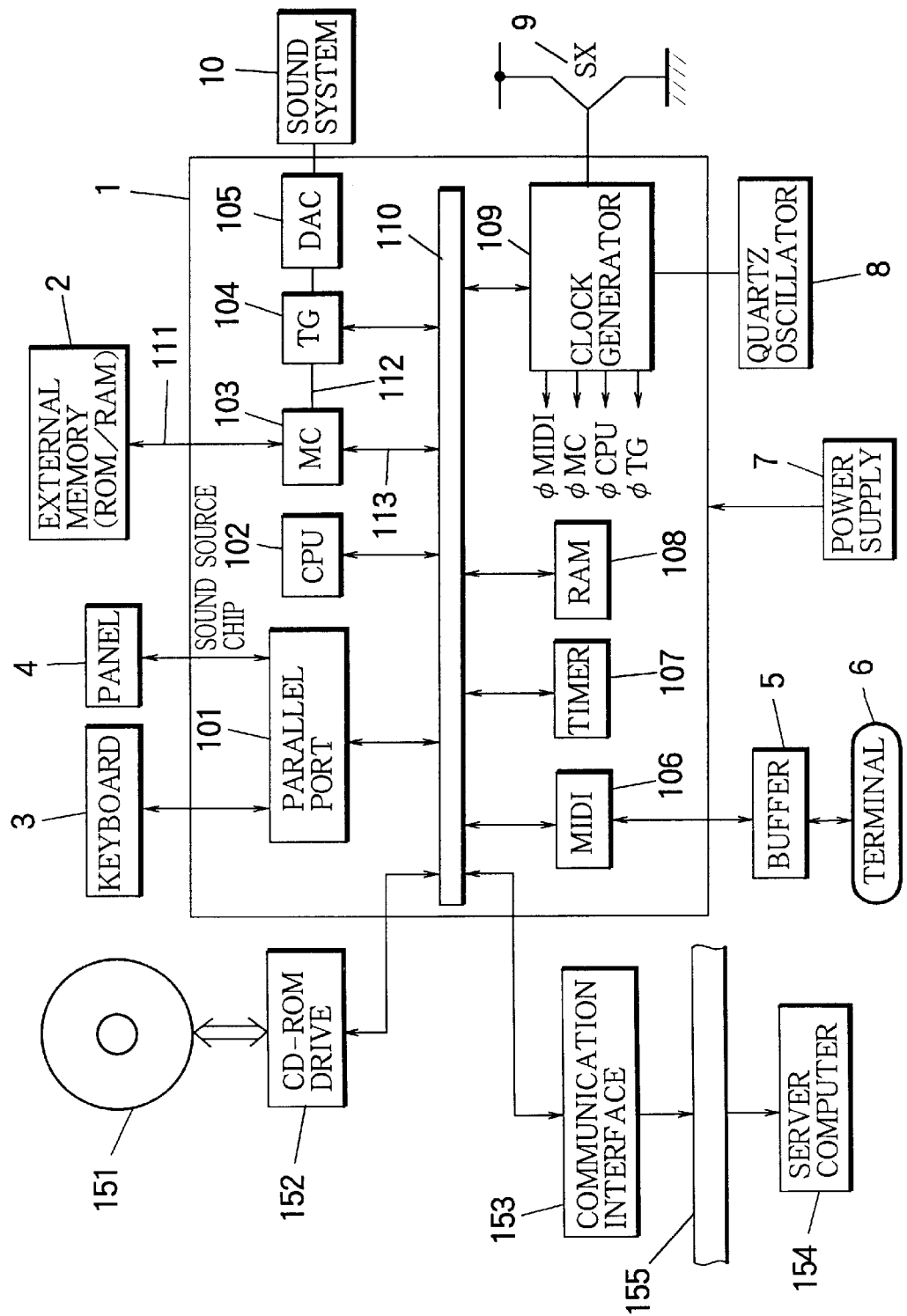

SOUND SOURCE CHIP HAVING VARIABLE CLOCK TO OPTIMIZE EXTERNAL MEMORY ACCESS

BACKGROUND OF THE INVENTION

The present invention relates to a sound source apparatus for generating a musical tone according to waveform data read out from a waveform memory. Specifically, the present invention relates to a sound source chip composed of a tone generating unit and a central processing unit integrated altogether in a semiconductor chip.

Conventionally, there is known an LSI device which integrates a tone generating unit (tone generator) of the waveform memory access type and a central processing unit (CPU) for controlling the tone generator within a single semiconductor chip. In such a device, the LSI chip is connected to an external memory which is commonly shared and accessed by the tone generator and the CPU. The external memory stores various information including waveform data retrieved by the tone generator and control programs retrieved by the CPU.

The external memory is shared such that the tone generator and the CPU access the external memory through a common address bus and a common data bus. It is necessary to alternately switch the external memory between the CPU and the tone generator. The switching is carried out statically such that a register is utilized to selectively connect the external memory to either of the CPU and the tone generator. Otherwise, the external memory is adaptively connected to the CPU or the tone generator dependently on an operating state of the tone generator. For example, access priority is normally given to the CPU and the access priority is passed to the tone generator when the same requires waveform data. In another manner, fixed time slots are individually allotted to either of the CPU and the tone generator so that the CPU and the tone generator alternately access the external memory at the respective time slots allotted thereto.

Generally, the LSI device integrated with the tone generator and the CPU utilizes a common master clock for both of the tone generator and the CPU. It is practical to decrease a frequency of the master clock as much as possible when the LSI chip is installed in various types of electronic musical instruments, in order to prolong a life of a battery which supplies an electric power to the LSI circuit and in order to suppress an unnecessary radiation of electromagnetic waves. However, an operating clock frequency of the CPU is determined dependently on the master clock frequency. Further, a sampling frequency of the waveform data by the tone generator is also determined dependently on the master clock frequency. The sampling frequency decreases as the master clock frequency decreases. The master clock frequency may be lowered to the extreme extent where only a minimum requirement is ensured for performance of the CPU. In such a case, the sampling frequency may decrease below an allowable level to thereby degrade quality of the musical tone.

Occasionally, the LSI chip may be supplied with a relatively low power voltage. In such a case, a fast master clock cannot be used due to operational limitation so that an actual master clock frequency must be set to a relatively low level. This also causes decrease in the sampling frequency to thereby hinder the quality of the musical tone. In order to secure the practical performance under the relatively low frequency of the master clock, it would be necessary to redesign circuitry structure of the LSI device. The conventional LSI device cannot be applied to different types of the electronic musical instrument having various performances.

In another aspect of the conventional LSI device composed of the tone generator and the CPU, the CPU is incidentally blocked from accessing the external memory according to a wait signal which is issued when the tone generator accesses the external memory to read out the waveform data. By such a conflict between the CPU and the tone generator in the access to the external memory, actual operating speed of the CPU is disadvantageously made slow.

SUMMARY OF THE INVENTION

An object of the invention is to provide an improved sound source chip which is composed of a tone generating unit and a central processing unit and which covers a wide range of a master clock frequency so that the sound source chip can be adapted to various types of electronic musical instruments while avoiding degradation of a musical tone.

Another object of the present invention is to provide an improved sound source chip which is composed of a tone generating unit and a central processing unit and which can avoid reduction in an operating speed of the central processing unit due to conflict between the central processing unit and the tone generating unit in accessing an external memory.

According to the first aspect of the invention, a sound source apparatus comprises a central processing unit integrated in a semiconductor chip and being operative in response to a primary operating clock signal for creating a control message, a tone generating unit integrated in the same semiconductor chip and being operative in response to a secondary operating clock signal for generating a musical tone according to the central message, master clock means for generating a master clock signal having a desired frequency selected from a plurality of frequencies, designating means for designating one of a first mode and a second mode corresponding to different operating speeds, and clock generating means for variably frequency-dividing the master clock signal to generate the primary operating clock signal and the secondary operating clock signal, the clock generating means being responsive to the designating means for changing a frequency ratio of the primary operating clock signal to the secondary operating clock signal between the first mode and the second mode.

In one form, the designating means designates the first mode when the master clock signal has a first frequency and designates the second mode when the master clock signal has a second frequency, wherein the first frequency is high relative to the second frequency. The clock generating means operates under the second mode for decreasing the frequency ratio of the primary operating clock signal to the secondary operating clock signal as compared to the first mode.

In another form, the designating means automatically switches between the first mode and the second mode according to an operating state of the central processing unit and the tone generating unit so as to prevent degradation of a quality of the musical tone.

In a typical form, an external memory is provided separately from the semiconductor chip for storing information required for generation of the musical tone. Allotting means is provided for allotting a primary time slot to the central processing unit and a secondary time slot to the tone generating unit. Control means is provided for selectively connecting the external memory to the central processing unit at the primary time slot so that the central processing unit can access the external memory to retrieve therefrom one share of the information in response to the primary operating clock signal so as to create the control message, and for selectively connecting the external memory to the tone generating unit at the secondary time slot so that the tone generating unit can access the external memory to retrieve therefrom another share of the information in response to the secondary operating clock signal so as to generate the musical tone. The control means is responsive to the designating means for changing a volume ratio of said one share allotted to the central processing unit relative to said another share allotted to the tone generating unit.

Specifically, the control means changes the volume ratio of said one share relative to said another share in terms of an access cycle of the central processing unit within the primary time slot and another access cycle of the tone generating unit within the secondary time slot. Otherwise, the control means changes the volume ratio of said one share relative to said another share in terms of a length of the primary time slot and another length of the secondary time slot.

In a form, the designating means designates the first mode when the master clock signal has a relatively high frequency and designates the second mode when the master clock signal has a relatively low frequency. In such a case, the control means operates under the second mode for decreasing the volume ratio of said one share relative to said another share as compared to the first mode.

According to the second aspect of the invention, a sound source apparatus comprises an external memory provided separately from the semiconductor chip for storing the waveform data and the control data such that a plurality of items of the control data is located in one address of the external memory, the tone generating unit integrated in a semiconductor chip for successively issuing an access request for a desired sample of waveform data so as to generate a musical tone, a central processing unit integrated in the same semiconductor chip for successively issuing another access request for a desired item of control data so as to control the tone generating unit, allotting means for allotting a time slot to enable the tone generating unit to access the external memory to retrieve therefrom the desired sample of the waveform data in response to the access request and for allotting another time slot to enable the central processing unit to access the external memory to retrieve a plurality of items of the control data including the desired item from one address of the external memory in response to a preceding access request, a cache memory provided in the semiconductor chip for temporarily reserving the plurality of the items of the control data which are retrieved from the external memory, and caching means operative in response to a succeeding access request issued by the central processing unit during the time slot allotted to the tone generating unit for transferring the desired item of the control data to the central processing unit from the cache memory if the desired item is contained in the plurality of the items temporarily reserved in the cache memory.

In a preferred form, the cache memory has means for temporarily reserving a next plurality of items of the control data which are retrieved in advance from the external memory during a current time slot allotted to the central processing unit while a current desired item of the control data is provided to the central processing unit from the cache memory, and the caching means includes means operative during a next time slot allotted to the central processing unit for transferring thereto a next desired item of the control data from the cache memory if the next desired item is contained in the next plurality of the items of the control data which are already reserved in the cache memory.

In the second aspect of the invention, the time slots are allotted such that the central processing unit accesses the external memory three times while the tone generating unit accesses the external memory once. Otherwise, the central processing unit makes three accesses, then the tone generating unit makes one access, further the central processing unit makes two accesses, and thereafter the tone generating unit makes one access in a variable manner. In any case, the central processing unit may issue an access request even at the time slot allotted to the tone generating unit. In such a case, the central processing unit can obtain the requested data from the cache memory by caching or pre-fetching. Further, in case that the central processing unit successively issues access requests for consecutive addresses of the external memory, items of the control data may be retrieved from the external memory in advance at a preceding time slot and are reserved in the cache memory. The reserved items may be provided to the central processing unit at a succeeding time slot in response to an access request. By such a manner, the central processing unit can instantly obtain the desired data without waiting even when the tone generating unit accesses the external memory. Such a caching is particularly efficient for fetching of a program by the central processing unit.

BRIEF DESCRIPTION OF THE DRAWINGS

FIG. 4A is a schematic diagram showing a memory map.

FIG. 4B is a table diagram showing various operating conditions of the sound source chip.

FIGS. 5A and 5B are timing charts showing memory access operation of the sound source chip.

FIG. 9 is a block diagram showing an additional embodiment of the inventive electronic musical instrument.

DETAILED DESCRIPTION OF THE INVENTION

Figure 1:
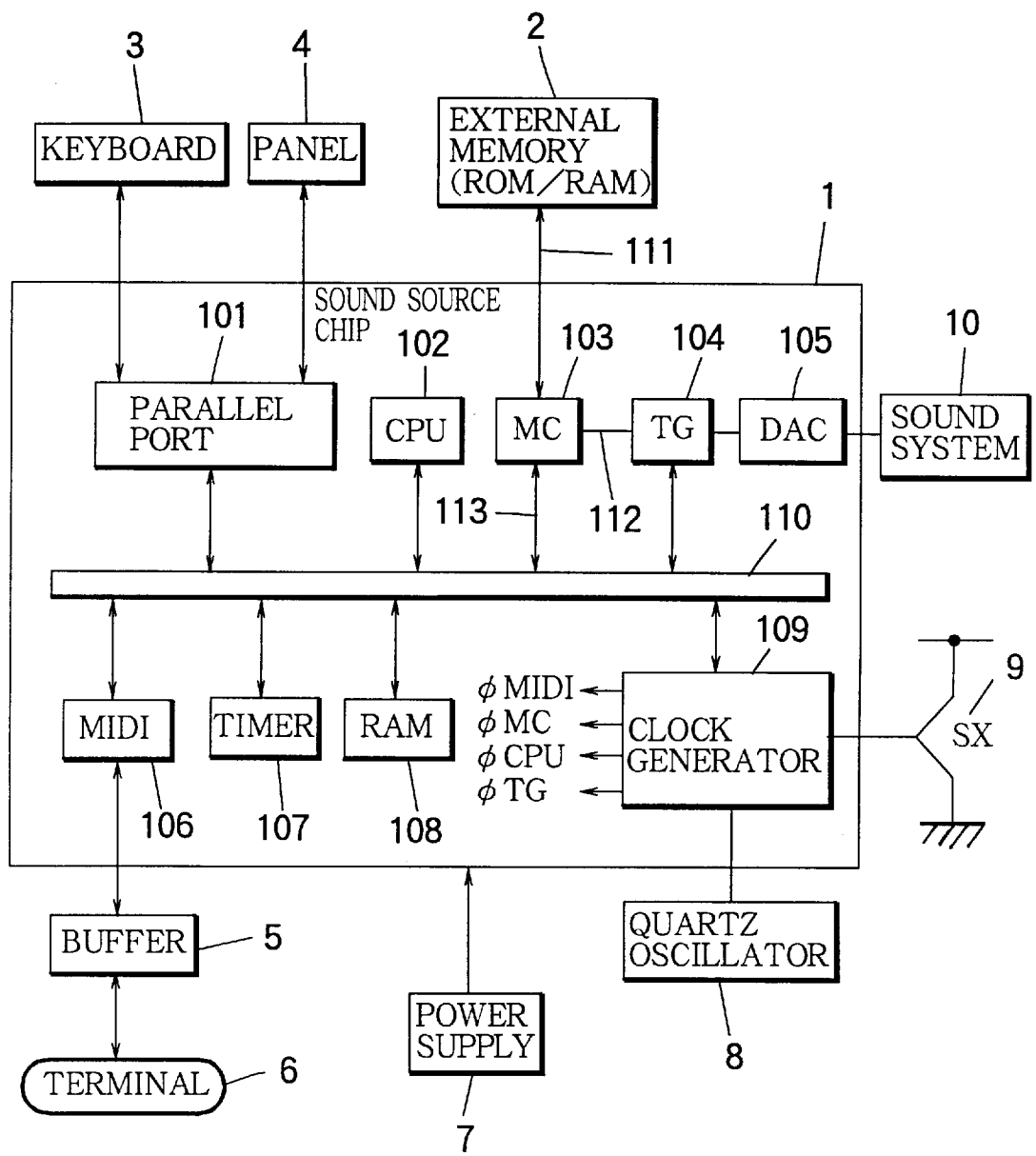
FIG. 1 is a block diagram showing overall construction of an electronic musical instrument utilizing a sound source chip according to the invention.

Hereinafter, preferred embodiments of the invention will be described in conjunction with the drawings. FIG. 1 is a block diagram showing construction of an electronic musical instrument using a sound source chip according to the invention. The electronic musical instrument is composed of a sound source chip 1, an external memory 2, a keyboard 3, a panel 4, a buffer 5, a MIDI terminal 6, a power supply 7, a quartz oscillator 8, a changer 9 and a sound system 10.

The sound source chip 1 is made of a semiconductor chip device formed with a large scale integrated circuit (LSI) containing a tone generating unit of a waveform readout type and a central processing unit (CPU) for controlling the tone generating unit (hereafter, tone generator). The external memory 2 is composed of a read-only memory (ROM) or a random access memory (RAM) for storing waveform data which is read out by the tone generator and a control program which is read out and executed by the CPU. The keyboard 3 is provided with a plurality of keys capable of being manipulated by a player to perform music. The panel 4 contains switches and indicators used for configuring the electronic musical instrument. The MIDI (Musical Instrument Digital Interface) terminal 6 is connected to another MIDI instrument to exchange MIDI data. The buffer 5 is provided to electrically interface between the MIDI instruments.

The power supply 7 supplies the sound source chip 1 with an operating voltage, a level of which can be selectively set to either of 3.3V or 5.0V. The quartz oscillator 8 determines a frequency of a master clock for the sound source chip 1. The quartz oscillator 8 having a desired oscillating frequency is set to meet designed performance of the electronic musical instrument. The oscillating frequency is selected from a range of 18 MHz–32 MHz in this embodiment. The changer (SX) 9 is used to change a frequency ratio between an operating clock of the CPU and another operating clock of the tone generator. Further, the changer 9 is used to change an interval ratio between an access time slot allotted to the CPU for accessing the external memory 2, and another access time slot allotted to the tone generator for accessing the external memory 2. The changer 9 is manually or automatically operated to switch the operation of the electronic musical instrument between one mode denoted by SX=0 and another mode denoted by SX=1. The frequency ratio of the operating clocks and the interval ratio of the access time slots are changed in response to the mode switching between SX=0 and SX=1. The sound system 10 outputs a musical sound according to a musical tone signal outputted from the sound source chip 1.

The sound source chip 1 integrates therein a parallel port 101, a CPU 102, a memory controller (MC) 103, a tone generator (TG) 104, a digital-to-analog converter (DAC) 105, a MIDI interface 106, a timer 107, a RAM 108, a clock generator 109 and a bus line 110. The parallel port 101 is an interface to connect the keyboard 3 and the panel 4 to the bus line 110. The CPU 102 detects operation states of the keyboard 3 and the panel 4 through the parallel port 101, and further feeds display data to the indicator of the panel 4. Moreover, the CPU 102 controls the entire operation of the electronic musical instrument. For example, when a user operates the panel 4 to select a timbre, the CPU 102 reads out necessary control data corresponding to the selected timbre from the external memory 2, and sets the read control data in a timbre designation data area of the internal RAM 108 assigned to the currently selected timbre. Further, when the CPU 102 detects the key operation of the keyboard 3 or receives a note-on event from the MIDI terminal 6, the CPU 102 responds to the detected or received information to provide the tone generator 104 with a note number and a note-on command together with the timbre control data reserved in the timbre designation data area. Moreover, when automatic play is requested for the electronic musical instrument, the CPU 102 reads out automatic play data from the external memory 2 and controls the tone generator 104 according to the read data to undergo the automatic play of music such as automatic performance and automatic accompaniment. The CPU 102 carries out various tasks as described above by sequentially retrieving and executing the program stored in the external memory 2.

The tone generator (TG) 104 of the waveform readout type is controlled by the CPU 102 to read out waveform data from the external memory 2 so as to generate the musical tone signal which is fed to the DAC 105. In detail, the tone generator 104 is composed of an address generator, an interpolating circuit, a digital filter including a low-pass filter, an envelope creating circuit, a mixer and an effecter. The address generator generates addresses of the external memory 2 from which the waveform data (waveform samples) are read out. The interpolating circuit carries out interpolation between the successive waveform samples using the read waveform data. The DAC 105 converts the digital tone signal outputted from the tone generator 104 into a corresponding analog tone signal which is fed to the sound system 10.

The memory controller (MC) 103 selectively connects one of the CPU 102 and the tone generator 104 to the external memory 2. The MIDI interface 106 is provided to interface with another MIDI instrument. The timer 107 is provided to trigger an interruption to the CPU 102. The timer 107 is used to generate a tempo clock for the automatic play and to control a time-dependent variation of musical tone characteristics such as the tone color (timbre) and the tone volume. The RAM 108 is provided within the sound source chip 1 for use as a work area of the CPU 102.

The external memory 2 stores one word composed of 16-bit data at one address. The data transfer is carried out in 16 bit units. The external memory 2 is connected to the memory controller (MC) 103 through address and data lines 111. The data line corresponds to a 16-bit length. The external memory 2 stores the waveform data composed of a sequence of sample values each having a 16-bit length. The tone generator 104 retrieves the waveform data from the external memory 2 through address and data lines 112. The data line corresponds to 16-bit length. The CPU 102 is comprised of an 8-bit microprocessor. Accordingly, the CPU line bus 110 has a data bus of 8-bit length and includes a branch portion 113 to the memory controller 103.

FIG. 4A schematically shows a composite memory map of the external memory 2 and the internal memory composed of the RAM 108. The memory map is divided into an area 401 belonging to the external memory 2 and another area 402 belonging to the internal RAM 108. The CPU 102 can access all of the areas on the memory map. As shown in the figure, the external memory 2 stores waveform data 403, automatic play data 404, timbre control data 405 and CPU program 406. The waveform data 403 represents a sequence of waveform samples which are read out by the tone generator 104. The automatic play data is read out by the CPU 102 when the automatic play is requested. The CPU 102 conducts the automatic play according to the read automatic play data. The timbre control data is read out by the CPU 102 when the user carries out the timbre designation operation. The CPU 102 allocates the read timbre control data to a timbre designation data area of the internal RAM 108, which corresponds to the currently designated timbre.

Referring back to FIG. 1, the clock generator 109 generates a master clock at the oscillating frequency of the quartz oscillator 8, and further frequency-divides the master clock to provide various blocks within the sound source chip 1 with operating clocks including ΦTG supplied to the tone generator 104 and ΦCPU supplied to the CPU 102. The tone generator 104 carries out time-divisional operation at each period of ΦTG to generate musical tones from a multiple of channels. When the tone generator 104 reads out the waveform data from the external memory 2, the tone generator 104 accesses the external memory 2 once for every four periods of ΦTG to retrieve one sample of the waveform data. Stated otherwise, the tone generator 104 is assigned with one access time slot for every four clocks of ΦTG. The tone generator 104 completes operation of each channel every eight periods or clocks of ΦTG. If the current channel is active to generate the musical tone, the tone generator 104 accesses the external memory 2 twice for every eight periods of ΦTG so as to read out two samples necessary for interpolation computation. Thus, the tone generator 104 accesses the external memory 2 once for every four periods of ΦTG to one sample of the waveform data having a 16-bit form.

On the other hand, the CPU 102 operates in response to the operating clock ΦCPU. When the CPU 102 reads out data from the external memory 2 such as to fetch the control program, the CPU 102 accesses the external memory 2 once for every one period or one clock of ΦCPU. Stated otherwise, the CPU 102 is assigned with one access time slot for every period of ΦCPU. The CPU 102 demands at most one access at each period for those of the external memory 2, the parallel port 101, the tone generator 104 and the internal RAM 108. Then, the CPU 102 immediately executes the demanded access within the corresponding period unless a wait signal takes place.

Characterizingly in this sound source chip 1, the frequency ratio between ΦTG and ΦCPU can be changed in response to the mode switching by the changer 9. As described before, the tone generator 104 carries out a time-divisional operation to generate musical tones from the multiple of the channels. The CPU 102 and the tone generator 104 share their access time slots within one interval time allotted to one channel. The frequency ratio between ΦTG and ΦCPU is changed according to the mode switching by the changer 9 to vary a number of access time slots of the CPU 102 and a number of access time slots of the tone generator 104 within one interval time allotted to one channel.

For example, under the mode SX=0, the frequency ratio of ΦTG and ΦCPU is set to 1:1. Under the other mode SX=1, the frequency ratio of ΦTG and ΦCPU is set to 2:1. The mode SX=0 is selected in order to raise performance of the CPU 102 such that the power supply 7 supplies a relatively high voltage and the quartz oscillator 8 has a relatively high oscillating frequency to speed up the master clock. Therefore, the frequency ratio of ΦTG relative to ΦCPU can be set lower such as 1:1 so as to ensure a practical sampling frequency of the waveform data sufficient to maintain acceptable music tone quality. On the other hand, the mode SX=1 is selected in order to degrade performance of the CPU 102 such that the power supply voltage is lowered and the oscillating frequency of the quartz oscillator is lowered to slow down the master clock. In such a case, the frequency ratio of ΦTG relative to ΦCPU is set higher such as 2:1 so as to ensure a practical sampling frequency of the waveform data to compensate for the slowdown of the master clock to thereby maintain the musical tone quality.

The clock generator 109 outputs a reference signal ΦMC for selectively and alternatively connecting the external memory 2 to either of the CPU 102 and the tone generator 104. When the reference signal ΦMC takes a logical level "1", the external memory 2 is coupled to the tone generator 104. When the reference signal ΦMC takes another logical level "0", the external memory 2 is coupled to the CPU 102. Particularly, the sound source chip 1 of this embodiment responds to the mode switching by the changer 9 so as to change the access time ratio between a CPU access time during which the CPU 102 is connected to the external memory 2 and a TG access time during which the tone generator (TG) 104 is connected to the external memory 2.

For example, the access time ratio of the CPU access time relative to the TG access time is set to 3:1 under the mode SX=0, whereas the access time ratio is set to 1:1 under the mode SX=1. As mentioned before, the mode SX=0 is selected in case that the performance of the CPU is raised by speeding up the master clock. Since the master clock is relatively fast, the TG access time can be set relatively short by selecting the access time ratio of 3:1 while maintaining a practical sampling frequency sufficient to ensure acceptable musical tone quality. On the other hand, the mode SX=1 is selected in case that the performance of the CPU is lowered by speeding down the master clock. In order to compensate for the slow master clock, the access time ratio of the TG access time relative to the CPU access time is raised to ensure a practical sampling frequency in order to avoid degradation of the music tone quality. Otherwise a number of the TG access times within a fixed time interval would be reduced due to the slowdown of the master clock to thereby hinder the quality of the musical tone. The clock generator 109 generates an additional operating clock ΦMIDI which controls input/output of the MIDI data.

Figure 2:
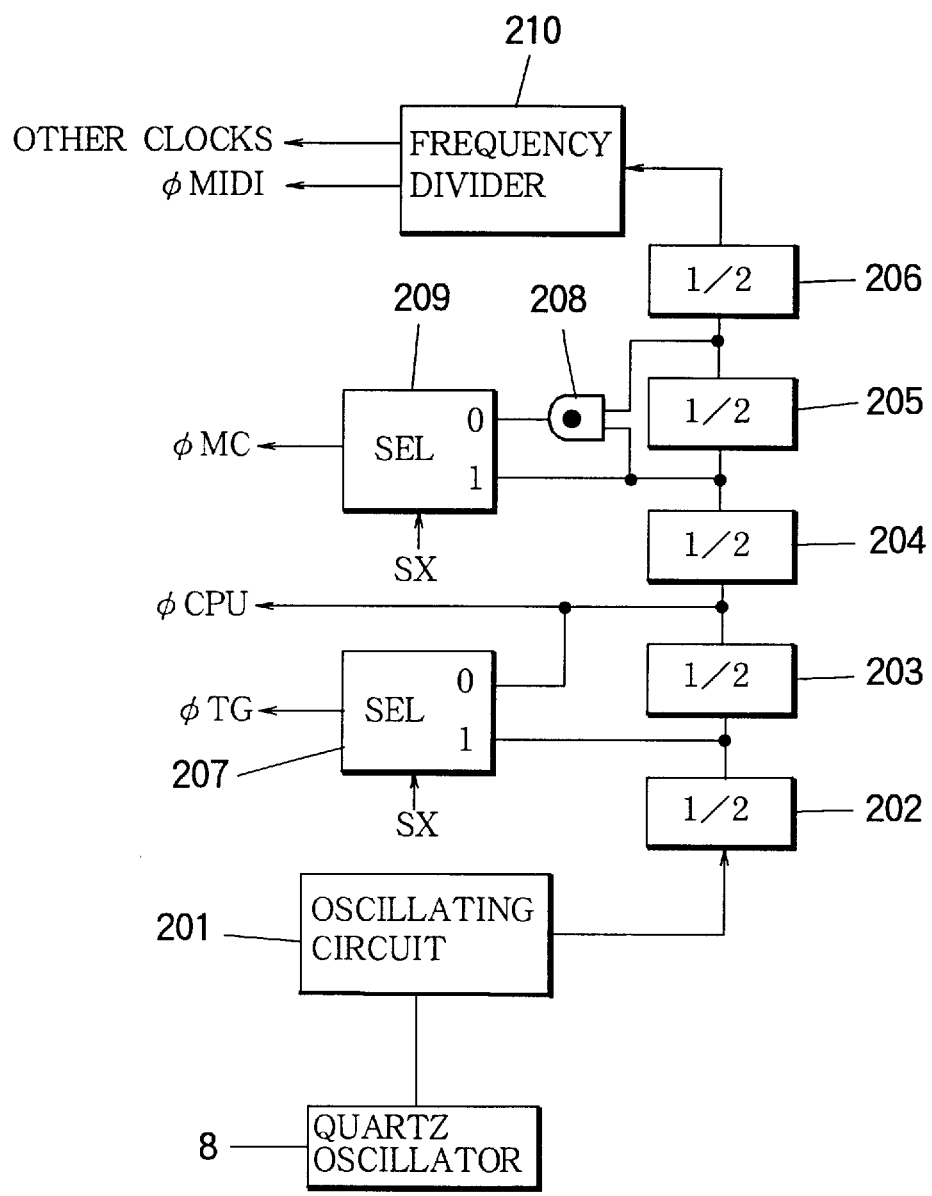
FIG. 2 is a block diagram showing detailed structure of a clock generator integrated in the sound source chip.

FIG. 2 is a block diagram showing detailed construction of the clock generator 109. The clock generator 109 is composed of an oscillating circuit 201, ½ frequency dividers 202–206, a selector 207, an AND circuit 208, another selector 209, and a frequency divider 210. The oscillating circuit 201 generates the master clock signal which has a frequency corresponding to that of the quartz oscillator 8 and which has a square pulse alternately shifting between a high level "1" and a low level "0" at the duty ratio of 50%. The master clock signal is frequency-divided by cascade connection of the ½ frequency dividers 202–206 at successive rates of ½, ¼, ⅛, ¹⁄₁₆ and ¹⁄₃₂. The output of the first ½ frequency divider 202 is fed to one input terminal "1" of the selector 207. The output of the second ½ frequency divider 203 is taken out as ΦCPU and is also fed to another input terminal "0" of the selector 207. The selector 207 operates under the mode SX=0 to select the output of the second ½ frequency divider as ΦTG, and otherwise operates under the mode SX=1 to select the output of the first ½ frequency divider 202 as ΦTG. Namely, under the mode SX=0, ΦTG has the same frequency as ΦCPU. Under the mode SX=1, ΦTG has twice the frequency as ΦCPU.

The output of the third ½ frequency divider 204 is fed to one input terminal "1" of the selector 209. The AND circuit 208 receives a pair of outputs from the third and fourth ½ frequency dividers 204, 205. An output terminal of the AND circuit 208 is connected to another input terminal "0" of the selector 209. The selector 209 operates under the mode SX=0 for selecting the output of the AND circuit 208 as ΦMC. Otherwise, the selector 209 operates under the mode SX=1 for selecting the output of the third ½ frequency divider as ΦMC.

Two periods of the output from the third ½ frequency divider 204 is divided equally by four to define first to fourth time slots. The output of the third ½ frequency divider 204 successively takes the levels "0", "1", "0" and "1" at the first, second, third and fourth time slots, respectively. The output of the fourth ½ frequency divider 205 takes the level "0" at the first and second time slots, and takes the level "1" at the third and fourth time slots. Thus, the output of the AND circuit 208 takes the level "0" at the first to third time slots, and takes the level "1" at the fourth time slot. Under the mode SX=0, the output of the AND circuit 208 is selected as ΦMC by means of the selector 209. This reference signal ΦMC is utilized to set the access time ratio of the CPU access time and the TG access time to 3:1 such that the CPU is connected to the external memory when ΦMC takes the level "0" and the tone generator is connected to the external memory when ΦMC takes the level "1". On the other hand, under the mode SX=1, the output of the third ½ frequency divider 204 is selected as it is by the selector 209 for ΦMC. The reference signal ΦMC is used to set the access time ratio of the CPU access time and the TG access time to 1:1. The level "0" of ΦMC determines an access time slot for the CPU, and the level "1" of ΦMC determines an access time slot for the tone generator.

The output of the fifth ½ frequency divider 206 is fed to the variable frequency divider 210 to provide ΦMIDI and other clock signals. Specifically, the frequency divider 210 has a variable frequency division rate controlled by the CPU 102 to produce ΦMIDI having a constant frequency while the frequency of the master clock is changed.

Figure 3:
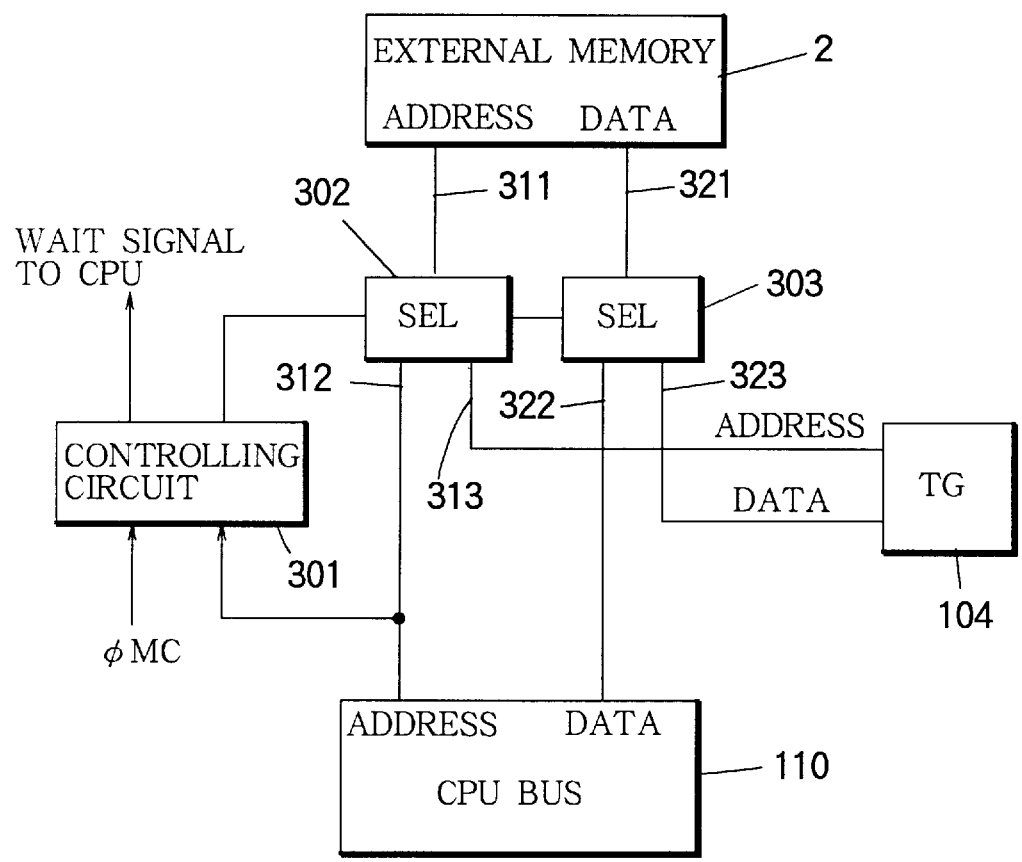
FIG. 3 is a block diagram showing detailed structure of an external memory controller integrated in the sound source chip.

FIG. 3 is a block diagram showing detailed construction of the memory controller (MC) 103. The memory controller 103 is composed of a controlling circuit 301 and a pair of selectors 302, 303. The selector 302 operates based on commands from the controlling circuit 301 to connect an address line 311 of the external memory 2 to either of an address line 312 of the CPU bus 110 or an address line 313 of the tone generator 104. In similar manner, the other selector 303 operates based on commands from the controlling circuit 301 to connect a data line 321 of the external memory 2 to either of a data line 322 of the CPU bus 110 or another data line 323 of the tone generator 104. The controlling circuit 301 operates in response to ΦMC inputted from the clock generator 109 so as to switch the selectors 302 and 303 such that the address lines 311 and 312 are coupled to each other and the data lines 321 and 322 are coupled to each other when ΦMC takes the level "0", while the address lines 311 and 313 are coupled to each other and the data lines 321 and 323 are coupled to each other when ΦMC takes the level "1".

As described before, the CPU 102 may make one access at each period of ΦCPU to one of the external memory 2 and the circuit blocks of the sound source chip including the port 101, the tone generator 104, the MIDI I/O and the internal RAM 108 which are connected to the bus 110. Even if the external memory 2 is connected to the tone generator 104 under ΦMC=1, the CPU 102 can freely access the internal circuit blocks of the sound source chip except for the external memory 2. In view of this, the controlling circuit 301 checks if the CPU 102 outputs an address to the external memory 2. When it is detected that the CPU 102 accesses the external memory 2 under the state of ΦMC=1, the controlling circuit 301 issues a wait signal to the CPU 102 to delay a retrieval timing of data from the external memory 2.

As described in conjunction with FIG. 1, the power supply 7 can supply an operating voltage selected from either of 3.3V and 5.0V to the sound source chip 1. Further, the quartz oscillator 8 can be selected from those having different oscillating frequencies to determine a desired frequency of the master clock. Moreover, the changer 9 can be switched between the modes SX=0 and SX=1.

FIG. 4B is a table diagram listing various settings of a nominal operating frequency of ΦCPU, an effective operating frequency of ΦCPU, and a sampling frequency Fs of the tone generator 104, classified in terms of the power supply voltage, the status of the changer (SX) 9 and the master clock frequency. The effective operating frequency of ΦCPU is calculated in taking account of access time slots allotted to the CPU for accessing the external memory 2. FIG. 5A is a timing chart showing access timings of the CPU 102 and the tone generator 104 to the external memory 2, in the case (2) listed in FIG. 4B, where the power supply voltage is set to 5.0V, the changer is set to the mode SX=0, and the master clock frequency is set to 28 MHz. FIG. 5B is another timing chart showing access timings of the CPU 102 and the tone generator 104 to the external memory 2, in the case (15) listed in FIG. 4B, where the power supply voltage is set to 3.3V, the changer is set to the mode SX=1, and the master clock frequency is set to 20 MHz.

Referring to FIG. 5A, the description is given for operation of the sound source chip under the mode SX=0. The oscillating circuit 201 shown in FIG. 2 generates a master clock 511. The clock generator 109 shown in FIG. 2 generates ΦTG denoted by reference 512 and ΦCPU denoted by reference 513. As described in conjunction with FIG. 2, the master clock is frequency-divided by the rate ¼ to generate ΦCPU and ΦTG under the mode SX=0. In such a case, an access time slot 514 is defined according to ΦTG. Each of the access time slots 514 is serially numbered from 000 to 255. The tone generator 104 uses these time slots 514 to time-divisionally operates 32 number of channels to generate the musical tones. The tone generator 104 operates one channel within eight time slots to process one key event. The first channel is operated within the time slots 000–007. The next channel is operated within the time slots numbered 008–015. The last channel is operated within the time slots numbered 248–255. FIG. 5A mainly shows the time slots numbered 248–255 allotted to the last channel as indicated by a unit process interval 515. The unit process interval 515 is shared by the CPU 102 and the tone generator 104 in time-divisional manner for accessing the external memory 2.

As described with reference to FIG. 2, under the mode SX=0, ΦMC 516 is generated such that the duty ratio of the level "0" and the level "1" is set to 3:1. Namely, one period of ΦMC denoted by reference 516 includes a first time slot 517 where ΦMC=0, and a second time slot 518 where ΦMC=1. The duty ratio of the time slots 517 and 518 is set to 3:1. As described in conjunction with FIG. 3, the memory controller (MC) 103 connects the external memory 2 to the CPU bus 110 when ΦMC=0, and otherwise connects the external memory 2 to the tone generator 104 when ΦMC=1. The CPU 102 accesses the external memory 2 in synchronization with the operating clock ΦCPU so that the CPU 102 can access three times at most within the allotted time slot 517. The tone generator 104 can access the external memory 2 once at the other time slot 518. Occasionally, the CPU 102 may issue one access request to the external memory 2 at the non-allotted time slot 518. In such a case, the actual access of the CPU 102 to the external memory 2 is delayed to a succeeding time slot numbered 252 in response to the wait signal. The tone generator 104 operates in response to ΦTG to access the external memory 2 within four successive clocks of ΦTG so that the tone generator 104 makes one access to the external memory 2 within the time slot denoted by 518. A sequence of the access time slots is denoted by reference 519. Each access time slot labeled "CPU" is allotted to the CPU 102, while each access time slot labeled "TG" is allotted to the tone generator 104. As shown in the figure, the CPU 102 can continuously access the external memory 2 three times, and then the tone generator 104 can access the external memory 2 one time. This cycle of the memory access is repeatedly carried out in response to ΦMC.

Next, the description is given for the operation of the sound source chip under the mode SX=1 with reference to FIG. 5B. The clock generator generates a master clock 521, ΦTG denoted by reference 522 and ΦCPU denoted by reference 523.

As noted with reference to FIG. 2, under the mode SX=1, the clock generator frequency-divides the master clock by the rate of ½ to generate ΦTG. Further, the clock generator frequency-divides the master clock by the rate of ¼ to generate ΦCPU. Each time slot defined by clocks of ΦTG is denoted by reference 524. This time slot 524 corresponds to the time slot 514 shown in FIG. 5A. A unit process interval denoted by reference 525 is allotted to the process of the last channel (CH31) of the tone generator 104. Each unit process interval of one channel is shared by the CPU 102 and the tone generator 104 to access the external memory 2.

As described in conjunction with FIG. 2, ΦMC has the duty ratio of the level "0" and the level "1" which is set 1:1 under the mode SX=1. The waveform of ΦMC is denoted by reference 526. As shown in the figure, one period of ΦMC includes a first slot 527 where ΦMC=0 and a second slot 528 where ΦMC=1. The duty ratio of the first and second slots 527 and 528 is set 1:1. The CPU 102 can access the external memory 2 at the time slot 527. The CPU 102 operates in response to the operating clock ΦCPU so that the CPU 102 can make one call to the external memory 2 within the time slot 527. On the other hand, the tone generator 104 can access the external memory 2 at the time slot 528. The tone generator 104 operates to make one access in response to four clocks of clock ΦTG which has the frequency twice as high as ΦCPU so that the tone generator 104 can make one call to the external memory 2 within the time slot 528. Occasionally, the CPU 102 may issue an access request to the external memory 2 at the non-allotted time slot 528. In such a case, the actual access to the external memory 2 is deferred until next time slots numbered 252 and 253 in response to a wait signal. A sequence of the access time slots is denoted by reference 529. In short, even if the CPU 102 continuously issues an access request to the external memory 2, the CPU 102 and the tone generator 104 alternately access the external memory 2.

In case of FIG. 5A, the frequency of the master clock is set to 28 MHz so that the nominal operating frequency of ΦCPU is frequency-divided to 7 MHz. However, actually the tone generator 104 makes one access after the CPU 102 successively makes the access three times. Therefore, the effective operating frequency of the CPU 102 for accessing the external memory 2 is calculated to 5.25 MHz which is ¾ of the nominal operating frequency 7 MHz. In general, under the mode SX=0, the operating frequency of ΦCPU is set ¼ of the frequency of the master clock. The effective operating frequency of the CPU becomes ¾ of ΦCPU. The tone generator 104 successively operates the 32 number of the channels within the 256 number of the time slots defined by ΦTG. Therefore, the tone generator 104 accesses the external memory 2 to sample therefrom the waveform data at a sampling frequency Fs of 27.3 kHz which is calculated by dividing the frequency 7 MHz of ΦTG with 256.

In case of FIG. 5B, the master clock frequency is set to 20 MHz. The nominal operating frequency of ΦCPU is set to 5 MHz which is ¼ of the master clock frequency. In this case, the CPU 102 and the tone generator 104 alternately access the external memory 2 at the same length of the access time slot. Therefore, the effective operating frequency of the CPU 102 for accessing the external memory 2 is set to 2.5 MHz which is ½ of 5 MHz of ΦCPU. In general, under the mode SX=1, the nominal operating frequency of ΦCPU is set to ¼ of the master clock frequency by the frequency-division. The effective operating frequency of the CPU is reduced to ½ of the nominal operating frequency of ΦCPU. On the other hand, the operating frequency of ΦTG is set to 10 MHz which is twice as much as the nominal operating frequency of ΦCPU. The tone generator 104 sequentially operates the 32 number of the channels within the 256 number of the time slots which are determined by ΦTG. Therefore, the sampling frequency Fs of the tone generator 104 is set to 39.06 kHz which is calculated by dividing 10 MHz of ΦTG with the slot number 256.

Referring back to FIG. 4B, the table lists the nominal operating frequency of ΦCPU, the effective operating frequency of the CPU 102 for accessing the external memory 2 and the sampling frequency Fs of the tone generator 104. As described with reference to FIG. 5A, under the mode SX=0, the frequency of ΦCPU is set to ¼ of the master clock frequency. The effective operating frequency of the CPU is set to ¾ of the frequency of ΦCPU. The sampling frequency Fs is set to $1/256$ of the frequency of ΦTG which is the same as the frequency of ΦCPU. Accordingly, the cases (1)–(4) and (9)–(12) have the respective sets of the frequency of ΦCPU, the effective operating frequency of the CPU and the sampling frequency Fs as listed in the FIG. 4B table.

As described with reference to FIG. 5B, under the mode SX=1, the frequency of ΦCPU is set to ¼ of the master clock frequency. The effective operating frequency the CPU is set to ½ of the frequency of ΦCPU. The sampling frequency Fs is set to $1/256$ of the frequency of ΦTG which is twice as much as the frequency of ΦCPU. Accordingly, under the mode SX=1, the cases (5)–(8) and (13)–(16) have the respective sets of the frequency of ΦCPU, the effective operating frequency of the CPU and the sampling frequency Fs as listed in the FIG. 4B table.

It should be noted that the cases (4) and (10–12) have the sampling frequencies marked by  in the FIG. 4B table. These sampling frequencies are too low to create musical tones having practical quality. The case (5) has the sampling frequency also marked by . This sampling frequency is too high to properly operate the tone generator 104. Therefore, these marked sampling frequencies are not practically used.

As seen from the FIG. 4B table, the inventive sound source chip 1 can adapt to a wide frequency range of the master clock. Further, the sound source chip 1 can be supplied with lower to higher operating voltages. Therefore, the inventive sound source chip 1 can be commonly used for various models of the electronic musical instruments from lower grades to higher grades. For example, when the inventive sound source chip 1 is used for a high performance model of the electronic musical instrument, the operating condition is such that the power supply voltage is set to 5.0V, the master clock is set to a high frequency and the mode is set to SX=0. On the other hand, when the inventive sound source chip 1 is applied to a low performance model of the electronic musical instrument, the operating condition is such that the power supply voltage is set to 3.3V, the master clock is set to a low frequency, and the mode is set to SX=1. Practically, in the electronic musical instrument utilizing the sound source chip 1, it is expedient to set the power supply voltage and the master clock frequency as low as possible to the extent where the CPU can fulfill required performance. In that case, the mode is set to SX=1 if the sampling frequency is too low under the mode SX=0.

The disclosed embodiment changes both of the frequency ratio between ΦTG and ΦCPU and the access time ratio between the CPU and the tone generator in response to the mode switching between SX=0 and SX=1. However, it is expedient to change one of the frequency ratio and the access time ratio. For example, the access time slots may be allotted to the CPU and the tone generator as described with reference to FIG. 5A under the mode SX=0. Under the other mode SX=1, the frequency of the ΦTG may be raised twice as much as compared to the setting shown in FIG. 5A while the access time ratio is held as it is. By such a manner, the tone generator can access the external memory twice at each time slot 518. In another modification, when the mode is changed to SX=1 from SX=0 where the CPU and the tone generator access the external memory as illustrated by FIG. 5A, the length of the time slot 517 allotted to the CPU is shortened by ⅔ so that the shortened time slot has the length corresponding to two periods of ΦCPU while the length of the time slot 518 allotted to the tone generator is prolonged by double so that the prolonged time slot has the length corresponding to two periods of ΦTG. By such a manner, the tone generator can access the external memory twice at each time slot 518 under the mode SX=1 and the CPU also can access the external memory twice at each time slot 517. In short, the tone generator accesses the external memory twice while the CPU accesses the external memory twice under the mode SX=1. The tone generator accesses the external memory once while the CPU accesses the external memory twice under the mode SX=0.

The electronic musical instrument using the inventive sound source chip 1 may be designed to fix the mode to either of SX=0 or SX=1. In such a case, the changer (SX) 9 of the sound source chip 1 is grounded to a predetermined voltage level when the power source is turned on to automatically select the mode SX.

In another modification, the mode is automatically switched to an optimum one of SX=0 and SX=1 according to operating state of the electronic musical instrument. For example, the mode is set to SX=1 to improve the quality of the musical tone when only the keyboard play is performed with relatively small work load on the CPU. On the other hand, the mode is set to SX=0 to raise performance of the CPU for the automatic play or else so that the electronic musical instrument can realize both of the high quality of the musical tone and the high musical performance. In such a case, the mode may be automatically switched to SX=0 when the user commands the automatic play. Otherwise, the mode is normally set to SX=1. When the work load of the CPU occasionally increases due to occurrence of a crowd of MIDI events or else. By such a manner, the musical tone of high quality can be created when the work load of the CPU is relatively light.

In modification, a single quartz oscillator may be used to provide a plurality of master clock frequencies by variably frequency-dividing an original oscillating frequency at a first stage of the cascade connection of the frequency-dividers, instead of selecting one of multiple quartz oscillators having different oscillating frequencies.

In modification, the CPU may execute a specific program so as to edit various data including the timbre control data, the automatic play data and the waveform data.

Further, it is not necessary to access the external memory for a silent channel of the tone generator 104, which is not currently creating a musical tone or which is dumping the musical tone such that the volume of the musical tone is negligibly small. In view of this, the tone generator 104 may notify the controller 301 of the existence of such a silent or idling channel. The controller 301 controls the selectors 302 and 303 to enable the CPU 102 to utilize an access time slot which is originally allotted to the silent channel.

As described above, according to the invention, the sound source chip containing the central processing unit (CPU) and the tone generating unit operates according to the designated mode to change the ratio of the operating frequencies between the first operating clock signal fed to the CPU and the second operating clock signal fed to the tone generator. When the frequency of the master clock is lowered, frequency of the second operating clock signal is raised relative to the frequency of the first operating clock signal so as to avoid decrease in the sampling frequency to thereby maintain the quality of the musical tone generated by the tone generator. Further, the inventive sound source chip operates according to the designated mode to change the ratio between the frequence of the external memory access by the CPU and the frequence of the external memory access by the tone generator. For example, when the master clock frequency is lowered, the frequence of the external memory access by the tone generator is raised relative to the frequence of the access to the external memory by the CPU. Alternatively, the sound source chip operates according to the designated mode to change the ratio between the length of the access time slot allotted to the CPU and the length of the access time slot allotted to the tone generator. For example, when the master clock frequency is lowered, the length of the access time slot allotted to the tone generator for retrieval of the waveform data is prolonged relative to the length of the access time slot allotted to the CPU. By such a manner, the master clock frequency can be lowered while maintaining the quality of the musical tone created by the tone generator. Thus, the inventive sound source chip can adapt for a wide frequency range of the master clock. Therefore, the inventive sound source chip can be utilized in the electronic musical instruments having various performances. Moreover, according to the invention, the optimum mode is automatically selected according to the operating condition of the electronic musical instrument. For example, when the load on the CPU increases during the automatic accompaniment play, the mode is automatically changed to boost the performance of the CPU. On the other hand, when the load on the CPU is relatively small, the mode is automatically changed to lower the performance of the CPU while maintaining the quality of the musical tone.

Referring back to FIG. 1, the external memory 2 has a data bus width of 16 bits. The data reading and writing of the external memory 2 is carried out in 16-bit data units. Namely, in accessing the external memory 2, a particular address is issued to designate one location where one word of 16-bit length is stored. The tone generator 104 reads out one sample value (having 16-bit length) of the waveform data at one access cycle. The tone generator 104 issues the address to the external memory 2 to specify one 16-bit sample of the waveform data. On the other hand, the CPU 102 operates to process an 8-bit length at once. The CPU 102 accesses the external memory 2 a unit by unit of 8-bit data width so as to retrieve necessary information including fetch of a program. The CPU 102 issues an address to the external memory 2 to designate one word of 8-bit length. The address is composed of a least significant bit (LSB) and other order bits (hereinafter, referred to as "net address"). The net address specifies one location of the external memory 2, which stores one set of 16 bits. The LSB takes "0" or "1" such that the value "0" designates a subset of higher order 8 bits and the value "1" designates another subset of lower order 8 bits within the complete set of 16 bits. Therefore, when the CPU 102 sequentially requests a train of 8-bit data to the external memory 2, the external memory 2 is accessed to read out the data in the order of higher order 8 bits of first 16-bit data, lower order 8 bits of the same first 16-bit data, higher order 8 bits of second 16-bit data, lower order 8 bits of the same second 16-bit data and so on. The higher order 8 bits are precedingly read out and the lower order 8 bits are succeedingly read out in the same 16-bit data.

When the CPU 102 takes in a desired subset of 8 bits, the external memory 2 is actually accessed to read out a set of 16 bits which contains that subset of 8 bits in the higher order part or the lower part of the 16-bit data. In view of this, the inventive sound source chip 1 operates in response to a request from the CPU 102 to access the external memory 2 to read out therefrom one set of 16 bits containing a requested subset of 8 bits. The requested subset of 8 bits is fed to the CPU 102, while the memory controller (MC) 103 reserves the read set of 16 bits. At a next time slot, when the CPU 102 requests a subset of 8 bits contained in the same set of 16 bits, the requested subset of 8 bits is transferred from the reserved set of 16 bits. Such a data transfer is called "caching". In the caching, the temporarily reserved data is transferred without accessing the external memory 2 at a time slot. Therefore, the tone generator 104 can access the external memory 2 at that time slot. By such a cache operation, the CPU 102 can retrieve a desired data event at a time slot in which the tone generator 104 accesses the external memory 2 if the desired data satisfies the condition that the subset of the desired data is contained in the temporarily reserved set of the data. Such a cache operation is effective when the CPU 102 sequentially reads out data from successive addresses for fetching instructions or else.

Figure 6:
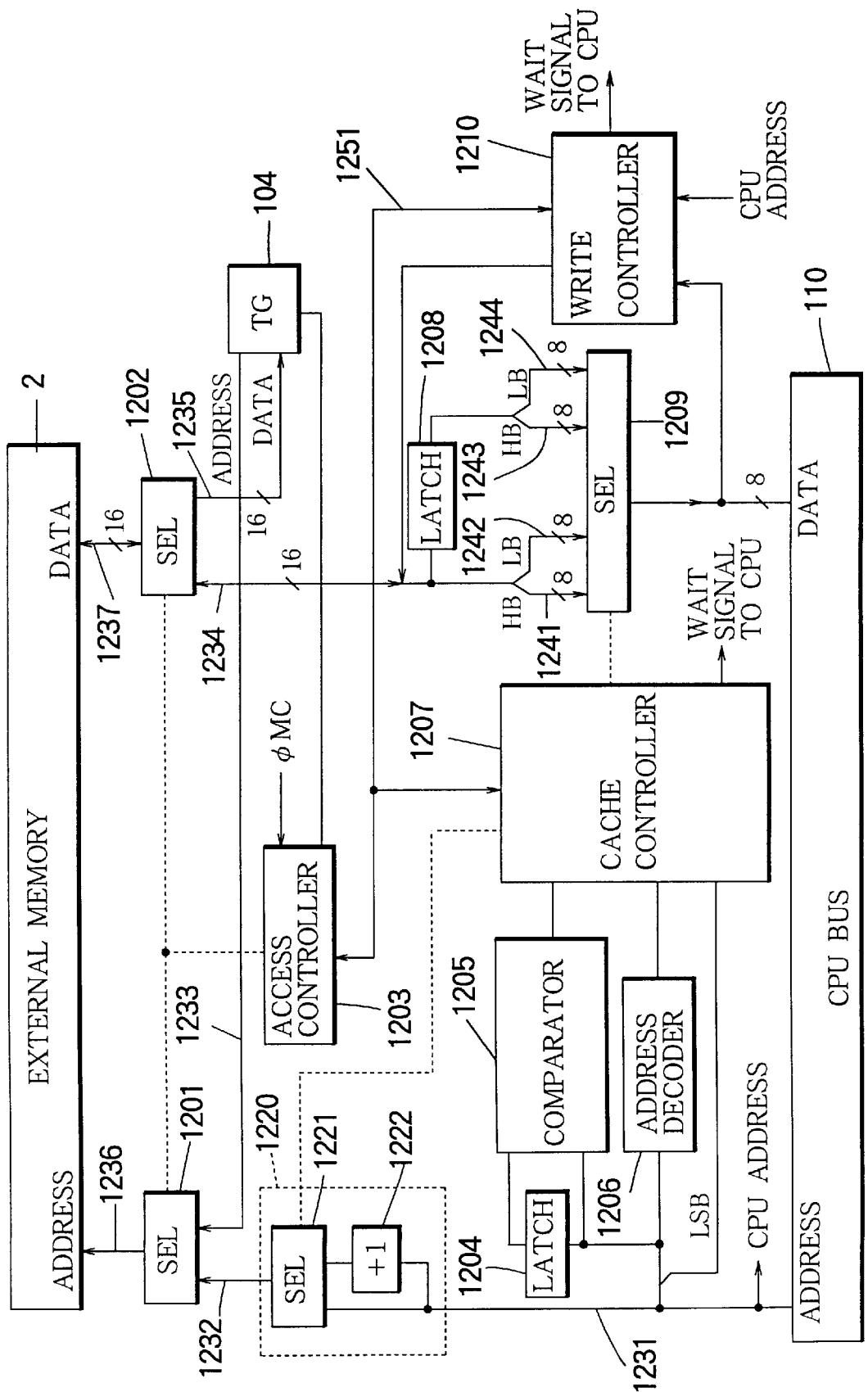
FIG. 6 is a block diagram showing another embodiment of the external memory controller.

FIG. 6 is a block diagram showing another embodiment of the memory controller (MC) 103 constructed to perform the cache operation when the CPU accesses the external memory 2. In the block diagram, a block 1220 is an optional one which can be added as a variation of the present embodiment of the memory controller 103. In the absence of the optional block 1220, an address line 1231 (except for LSB) of the CPU bus 110 is directly connected to an input 1232 of a selector 1201.

The memory controller 103 of FIG. 6 is composed of selectors 1201 and 1202, an access controller 1203, a latch 1204, a comparator 1205, an address decoder 1206, a cache controller 1207, another latch 1208, a selector 1209 and a write controller 1210.

The LSB of the address from the CPU bus 110 is inputted into the cache controller 1207. The net address from the CPU bus 110 is fed to those of one input of the selector 1201 through an address line 1232, the address decoder 1206, one input of the comparator 1205 and the latch 1204. An output of the latch 1204 is connected to another input of the comparator 1205. Decoded result of the address decoder 1206 is fed to the cache controller 1207. Compared result of the comparator 1205 is fed to the cache controller 1207. The cache controller 1207 switches the selector (SEL) 1209 according to the outputs from the comparator 1205 and the address decoder 1206 and according to the LSB of the CPU address.

An output of the selector (SEL) 1201 is connected to an address line 1236 of the external memory 2. One input of the selector 1201 receives the net address issued from the CPU 2 as described before. Another input of the selector 1201 is connected to an address line 1233 from the tone generator (TG) 104. The other selector 1202 is connected to those of a data line (16-bit) 1237 from the external memory 2, another data line (16-bit) 1234 from the CPU bus 110 and a further data line (16-bit) 1235 from the tone generator 104. The selector 1202 can bidirectionally transfer the data in order to write and read the data to and from the external memory 2. The data writing is effected only if the external memory 2 is composed of RAM. In a practical form, the selector 1202 is divided into an upward selector for use in writing of the data into the external memory 2 and a downward selector for use in reading of the data from the external memory 2. The access controller 1203 switches the address selector 1201 and the data selector 1202 in response to ΦMC fed from the clock generator 109 and according to idling channel information fed from the tone generator 104.

The 8-bit data line of the CPU bus 110 is connected to an output terminal of the selector 1209 and to the write controller 1210. An input terminal of the selector 1209 is connected to four data lines 1241–1244. The data line 1241 is connected to a higher order 8-bit portion (HB) of the data line 1237 of the external memory 2 through the selector 1202. The data line 1242 is connected to a lower order 8-bit portion (LB) of the data line 1237 of the external memory 2 through the selector 1202. The data line 1243 is connected to a higher order 8-bit portion (HB) of the output terminal of the latch 1208. The data line 1244 is connected to a lower order 8-bit portion (LB) of the output terminal of the latch 1208. An input terminal of the latch 1208 is connected to the 16-bit data line of the external memory 2 through the selector 1202.

The write controller 1210 has a data line which feeds data to be written and which connects to the input data line 1234 of the selector 1202. A control line 1251 is provided to exchange a control signal among the access controller 1203, the cache controller 1207 and the write controller 1210.

Description is given for operation of the external memory control circuit (MC) 103 shown in FIG. 6. The access controller 1203 switchably connects the external memory 2 to either of the CPU and the tone generator. In detail, the access controller 1203 operates when ΦMC=1 and the tone generator 104 does not issue channel vacancy information for connecting the external memory 2 to the tone generator 104 so as to read out waveform data for one channel at one time slot. Otherwise, the access controller 1203 connects the external memory 2 to the CPU. The channel vacancy information indicates that the one channel processed at the one time slot is placed in silent state or almost dumping state.

When connecting the external memory 2 to the tone generator, the access controller 1203 operates the selectors 1201 and 1202 such that the address line 1236 of the external memory 2 is connected to the address line 1233 of the tone generator 104 and the data line 1237 of the external memory 2 is connected to the data line 1235 of the tone generator 104. By such a manner, an address outputted from the tone generator 104 is inputted into the external memory 2. In return, a waveform data sample stored at that address is retrieved from the external memory 2 and is fed to the tone generator 104 through the selector 1202.

When connecting the external memory 2 to the CPU, the access controller 1203 operates the selectors 1201 and 1202 such that the address line 1236 of the external memory 2 is connected to the address line 1232 of the CPU bus 110 and the data line 1237 of the external memory 2 is connected to the data line 1234 of the CPU bus 110.

The CPU 102 issues a memory access request for data reading or data writing independently from the access controller 1203 which selectively connects the external memory 2 to either of the CPU and the tone generator. The CPU 102 issues the access request accompanied by an address. LSB of the address is inputted into the cache controller 1207. The remaining bits of the address (net address) is inputted into the address decoder 1206. The address decoder 1206 decodes the net address from the CPU 102 and outputs decoded results to the cache controller 1207. The cache controller 1207 recognizes which of the external memory 2 and the internal memory 103 is to be accessed by the CPU 102 based on the output from the address decoder 206. The address decoder detects when the CPU 102 accesses other than the external memory 2. In such a case, the external memory control circuit (MC) 103 does not connect the CPU bus 110 and the external memory 2 to each other.

The following description is given when the cache controller 1207 detects that the CPU 102 issues an access request for the external memory 2 according to the output from the address decoder 1206. First, the latch 1204 latches the net address issued from the CPU 102. At the same time, the latch 1204 outputs a previous net address latched therein to the comparator 1205. The comparator 1205 compares the previous net address latched in the latch 1204 with the current net address issued from the CPU. The compared result is outputted to the cache controller 1207. By such a manner, the cache controller 207 judges coincidence between the previous read address at the preceding access and the current read address at the succeeding access whenever the CPU 102 issues an access request. Further, the cache controller 1207 detects whether 8-bit data to be read out is lower order eight bits or higher order eight bits of 16-bit data stored in the external memory 2 according to LSB of the address issued from the CPU 102. Namely, LSB=0 denotes the higher order and LSB=1 denotes the lower order. Moreover, the cache controller 1207 discriminates whether the current time slot is allotted to the CPU or the tone generator according to a control signal from the access controller 1203.

By such a manner, the cache controller 1207 recognizes three conditions when the CPU 102 issues the access request for the external memory 2. The first condition is whether the current time slot is allotted to the CPU or the tone generator. The second condition is whether the previous net address at the preceding access coincides with the current net address at the succeeding access. The third condition is whether the requested 8-bit data is a higher order bit set or a lower order bit set of the 16-bit data stored in the external memory 2.

The external memory control circuit (MC) 103 including the cache controller 1207 operates as follows according to the first, second and third conditions.

(1) When the current time slot is allotted to connection between the CPU and the external memory 2, the MC 103 operates as follows.

(1-1) If the current net address at the succeeding access is different from the previous net address at the preceding access, the requested data is retrieved from the external memory 2 and is fed back to the CPU 102. At the current time slot, the external memory 2 is connected to the CPU. Therefore, the net address fed from the CPU bus 110 is inputted into the external memory 2 through the selector 1201 so that the 16-bit data is retrieved from that address. The higher order 8-bit set of the retrieved 16-bit data is inputted into the selector 1209 through the data line 1241. The lower order 8-bit set of the same 16-bit data is also inputted into the selector 1209 through the separate data line 1242. The cache controller 1207 operates when LSB of the address issued by the CPU 102 indicates "0" to control the selector 1209 to select the data line 1241 so that the higher order 8-bit set (HB) of the 16-bit data retrieved from the external memory 2 is fed to the CPU bus 110. Otherwise, when LSB indicates "1", the data line 1242 is selected so that the lower order 8-bit set (LB) of the retrieved 16-bit data is fed to the CPU bus 110. Further, the 16-bit data retrieved from the external memory 2 is latched in the latch 1208 to effect "caching".

(1-2) If the current read address coincides with the previous read address, it is not necessary to access the external memory 2 since the 16-bit data previously retrieved from the external memory 2 is latched as cache in the latch 1208. At the current time, higher or lower 8-bit set may be transferred from the latch 1208 to the CPU 102. In view of this, the cache controller 1207 operates based on LSB of the read address from the CPU 102 to selectively takes the higher or lower 8-bit sets (HB or LB) of the 16-bit data latched in the latch 1208. Namely, when LSB="0", the data line 1243 is selected by the selector 1209 to feed the higher order 8-bit data (HB) latched in the latch 1208 to the data line of the CPU bus 110. When LSB="1", the data line 1244 is selected by the selector 1209 to feed the lower order 8-bit data (LB) to the data line of the CPU bus 110. Alternatively, the requested data may be directly retrieved from the external memory 2 rather than the latch 1208 under the case (1-2) since the current time slot is allotted to the connection between the CPU and the external memory 2 like the case (1-1).

(2) When the current time slot is allotted to the connection between the external memory 2 and the tone generator, the external memory control circuit (MC) operates as follows.

(2-1) When the current read address issued from the CPU 102 is different from the previous read address, the cache controller 1207 feeds a wait signal (WAIT) to the CPU 102 to defer the access by the CPU 102 to the external memory 2 since the current time slot is not allotted to the CPU and the CPU cannot take out the desired data from the cache latch 1208.

(2-2) When the current read address issued from the CPU 102 coincides with the previous read address; the requested data must be contained in the 16-bit data which is previously retrieved from the external memory 2 and is currently latched in the cache latch 1208. In view of this, the cache controller 1207 operates based on LSB of the read address from the CPU 102 to control the selector 1209 to feed the higher or lower order 8-bit set of the 16-bit data latched in the latch 1208 to the CPU in manner similar to the case (1-2). In the case (2-2), the current time slot is allotted to the connection between the external memory 2 and the tone generator. Therefore, the tone generator 104 accesses the external memory 2 to retrieve therefrom a sample of the waveform data. In parallel to the access by the tone generator 104, the CPU can obtain the requested data as if the CPU directly accesses the external memory 2.

The CPU 102 issues the read access request to the external memory in the above described cases (1) and (2). The write controller 1210 is provided to write data into the external memory 2 when the same is comprised of a random access memory (RAM). When the CPU 102 issues write access request to the external memory 2, the write controller 1210 writes data provided from the CPU bus 110 into the external memory 2 when the current time slot is allotted to the CPU. When the current time slot is allotted to the tone generator, the write controller 1210 issues a wait signal (WAIT) to the CPU 102 so that the CPU 102 suspends the writing of data.

Figure 7:
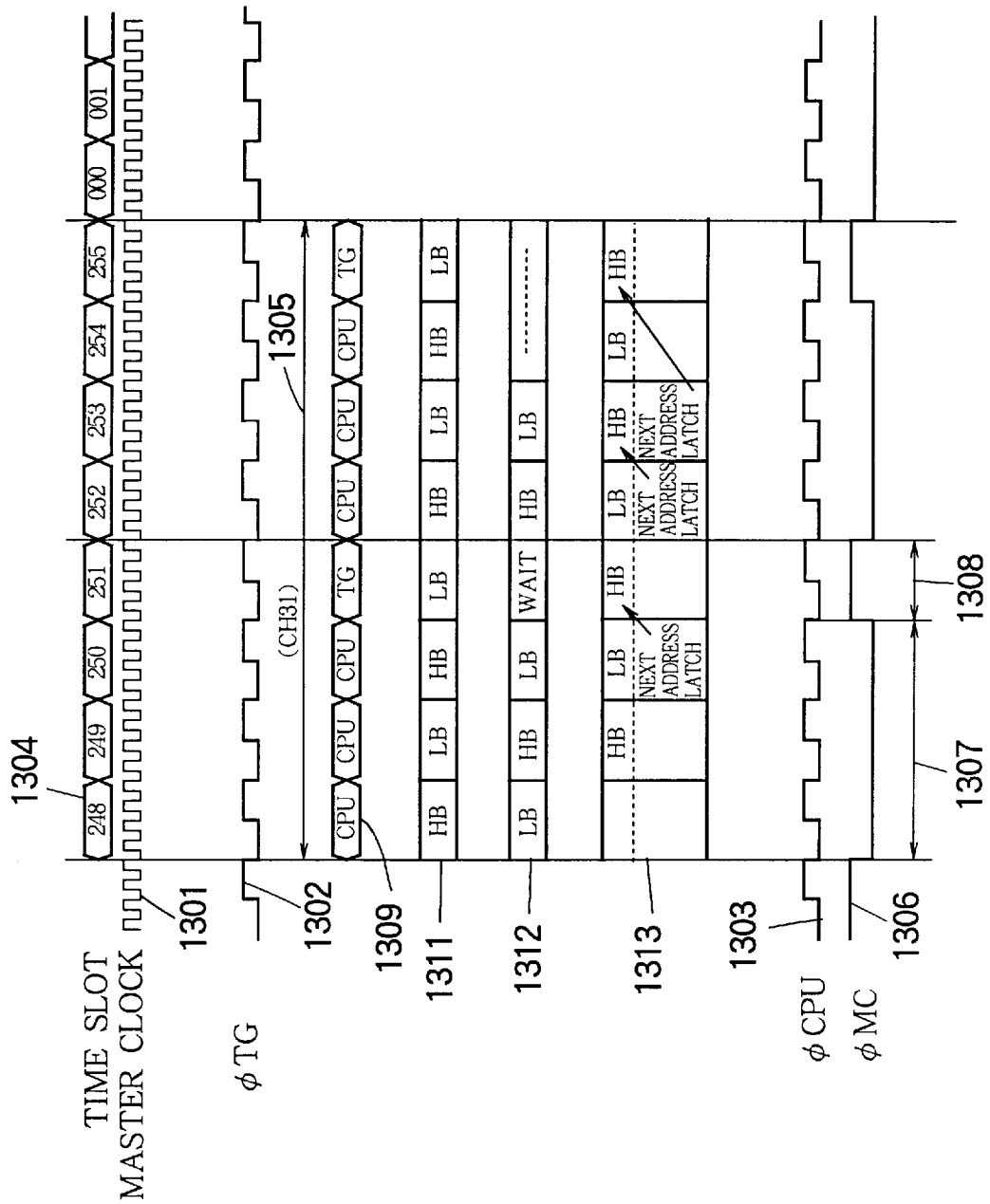
FIG. 7 is a timing chart showing an example of the memory access operation.

Referring to FIG. 7, the description is given for operation of the sound source chip under the mode SX=0. The oscillating circuit 201 shown in FIG. 2 generates a master clock 1301. The clock generator 109 shown in FIG. 2 generates ΦTG denoted by reference 1302 and ΦCPU denoted by reference 1303. As described in conjunction with FIG. 2, the master clock is frequency-divided by the rate ¼ to generate ΦCPU and ΦTG under the mode SX=0. In such a case, an access time slot 1304 is defined according to ΦTG. Each of the access time slots 1304 is serially numbered from 000 to 255. The tone generator 104 uses these time slots 1304 to time-divisionally operates 32 channels to generate the musical tones. The tone generator 104 operates one channel within eight time slots to process one key event. The first channel is operated within the time slots 000–007. The next channel is operated within the time slots numbered 008–015. The last channel is operated within the time slots numbered 248–255. FIG. 7 mainly shows the time slots numbered 248–255 allotted to the last channel as indicated by a unit process interval 1305. The unit process interval 1305 is shared by the CPU 102 and the tone generator 104 in time-divisional manner for accessing the external memory 2.

As described with reference to FIG. 2, under the mode SX=0, ΦMC 1306 is generated such that the duty ratio of the level "0" and the level "1" is set to 3:1. Namely, one period of ΦMC denoted by reference 1306 includes a first time slot 1307 where ΦMC=0, and a second time slot 1308 where ΦMC=1. The duty ratio of the time slots 1307 and 1308 is set to 3:1. As described in conjunction with FIG. 6, the memory controller (MC) 103 connects the external memory 2 to the CPU bus 102 when ΦMC=0, and otherwise connects the external memory 2 to the tone generator 104 when ΦMC=1. As denoted by reference 1309, the CPU 102 is allowed to access the external memory 2 at each access time slot labeled by "CPU", while tone generator 104 is allowed to access the external memory 2 at each access time slot labeled by "TG".

As described with reference to FIGS. 1 and 6, in response to the access request to the external memory from the CPU 102, the data latched in the latch 1208 is read and fed to the CPU 102 without actually accessing the external memory 2 when the data to be retrieved from the external memory 2 is already reserved in the latch 1208. Therefore, even at the access time slot "TG" allotted to the tone generator, the CPU 102 can obtain the desired data in response to the access request. On the other hand, even at the access time slot "CPU" allotted to the CPU 102, the CPU 102 may not issue an access request to the external memory 2.

For example as denoted by reference 1311, the CPU 102 may receive a sequence of 8-bit data sets from the external memory 2 in response to read accesses of consecutive addresses. The CPU 102 issues a read access request for a higher order 8-bit set of 16-bit data from a certain address at the 248-th time slot. At this time, the 16-bit data is retrieved from the external memory 2 at the address designated by the CPU 102. Then, the higher order 8-bit set (HB) of the retrieved 16-bit data is fed to the CPU 102. Further, the retrieved 16-bit data is reserved in the latch 1208 as cache. The process at the 248-th time slot corresponds to the case (1-1).

Next, at the 249-th time slot, the CPU 102 issues a read access request for data at a next address, which is the lower order 8-bit data set (LB) of the same 16-bit data. At this time, the data of the designated net address of the next address is already reserved in the latch 1208 so that the reserved lower order 8-bit data (LB) is provided to the CPU 102. The process at the 249-th time slot corresponds to the case (1-2).

Further, at the 250-th time slot, the CPU 102 issues a read access request for desired data of a next address, which is a higher order 8-bit set (HB) of next 16-bit data. At this time, the next address of the designated address is different from the previous net address reserved in the address latch 1204. Therefore, the next 16-bit data is retrieved from the next net address of the external memory 2, and is reserved in the cache latch 1208. At the same time, the higher order 8-bit set (HB) of the retrieved 16-bit data is instantly fed to the CPU 102. The process at this 250-th time slot corresponds to the case (1-1).

Further, at the 251-th time slot, the CPU 102 issues a read access request for data of a next address, which is the lower order 8-bit data set of the previous 16-bit data. At this time, the desired data of the designated address is already reserved in the latch 1208. Therefore, the lower order 8-bit data (LB) is transferred from the latch 1208 to the CPU 102. In parallel to this data caching, the tone generator 104 retrieves the waveform data from the external memory 2 at the 251-th time slot. The process at the 251-th time slot corresponds to the case (2-2).

As another example denoted by reference 1312, the CPU 102 sequentially receives 8-bit data sets in response to read access requests of consecutive addresses. In contrast to the previous example denoted by reference 1311, the initial read access request is started from a lower order 8-bit set of 16-bit data. At the 248-th slot, the CPU 102 issues a read access request for a lower order 8-bit set (LB) of 16 bit data at a certain address. The requested LB is retrieved from the external memory 2. At the 249-th slot, the CPU 102 issues another read access request for a higher order 8-bit set (HB) of next 16 bit data at a next address. The requested HB is retrieved from the external memory 2. At the 250-th slot, the latch 1208 already reserves the lower order 8-bit data set of the 16-bit data from which the higher order 8-bit data set is already read out at the preceding 249-th time slot. Thus, the CPU 102 can obtain the reserved or latched lower order 8-bit set (LB) without accessing the external memory 2. At the subsequent 251-th slot, the CPU 102 issues a read access request for a higher order 8-bit set (HB) of next 16-bit data at a next address. However, the tone generator 104 accesses the external memory 2 at the 251-th slot. Further, the current net address designated by the CPU 102 is different from the previous net address. Thus, the current read access request by the CPU 102 is temporarily suspended in response to a wait signal. This process corresponds to the case (2-1). The next 252-th slot is started from reading of higher order 8-bit set (HB) so that the CPU 102 can obtain the desired data at the subsequent 255-th slot without waiting in manner similar to the previous example denoted by reference 1311 as long as data reading continues from successive addresses.

Figure 8:
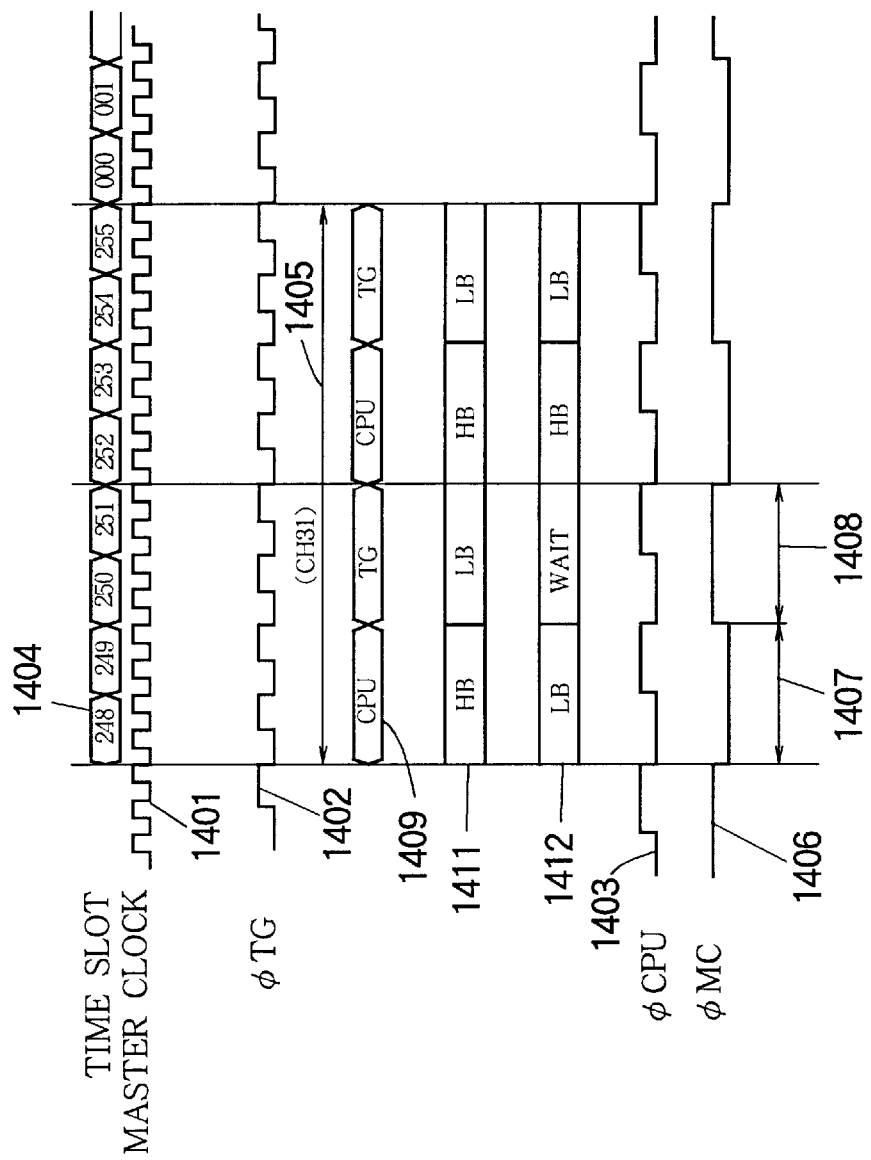
FIG. 8 is a timing chart showing another example of the memory access operation.

Next, the description is given for the operation of the sound source chip under the mode SX=1 with reference to FIG. 8. The clock generator generates a master clock 1401, ΦTG denoted by reference 1402 and ΦCPU denoted by reference 1403. As noted with reference to FIG. 2, under the mode SX=1, the clock generator frequency-divides the master clock by the rate of ½ to generate ΦTG. Further, the clock generator frequency-divides the master clock by the rate of ¼ to generate ΦCPU. Each time slot defined by ΦTG is denoted by reference 1404. This time slot 1404 corresponds to the time slot 1304 shown in FIG. 7. A unit process interval denoted by reference 1405 is allotted to the process of the last channel (CH31) of the tone generator 104. Each unit process interval of one channel is shared by the CPU 102 and the tone generator 104 to access the external memory 2. As described in conjunction with FIG. 2, ΦMC has the duty ratio of the level "0" and the level "1" which is set 1:1 under the mode SX=1. The waveform of ΦMC is denoted by reference 1406. As shown in FIG. 8, one period of ΦMC includes a first slot 1407 where ΦMC=0 and a second slot 1408 where ΦMC=1. The duty ratio of the first and second slots 1407 and 1408 is set 1:1. The CPU 102 can access the external memory 2 at the time slot 1407. The CPU 102 operates in response to the operating clock ΦCPU so that the CPU 102 can make one call to the external memory 2 within the time slot 1407. On the other hand, the tone generator 104 can access the external memory 2 at the time slot 1408. The tone generator 104 operates to make one access in response to four clocks of ΦTG which has the frequency twice as high as ΦCPU so that the tone generator 104 can make one call to the external memory 2 within the time slot 1408.

For example as denoted by reference 1411, the CPU 102 can receive a sequence of 8-bit data sets in response to read access requests at consecutive addresses. At the first slot 1407 which contain the 248-th and 249-th time slot, the CPU 102 issues a read access request for a higher order 8-bit data set (HB) of 16-bit data at a designated address. At this time, the 16-bit data is retrieved from the external memory 2 according to a net address value of the designated address. The higher order 8-bit data set (HB) thereof is provided to the CPU 102. Further, the retrieved 16-bit data is reserved at the latch 1208. The process at the time slot 1407 corresponds to the case (1-1).

At the next slot 1408 which contains the 250-th and 251-th time slots, the CPU 102 issues another read access request for a lower order 8-bit data set (LB) of the same 16-bit data at a next designated address. At this time, the requested LB is already reserved in the latch 1208 so that the LB is transferred from the latch 1208 to the CPU 102 without accessing the external memory 2. The process at this time slot 1408 corresponds to the case (1-2).

As another example denoted by reference 1412, the CPU 102 obtains a sequence of 8-bit data sets in response to read access requests at consecutive addresses. In contrast to the previous example denoted by reference 1411, the initial read access request is started for a lower order 8-bit set of 16-bit data. At the slot 1407, a read access request is issued for a lower order 8-bit set (LB) of 16-bit data at a certain address. The CPU 102 receives the LB retrieved from the certain address of the external memory 2. At the next time slot 1408, the CPU 102 issues another read access request for a higher order 8-bit data set (HB) at a next address. However, this time slot is allotted to the tone generator 104. Further, the current net address designated by the CPU 102 is different from the previous net address. Therefore, the current read access request by the CPU 102 is suspended momentarily. This process corresponds to the case (2-1). At the next time slot, the data reading is started from a higher order 8-bit set so that the data reading process is made identical to the previous example denoted by reference 1411 as long as the read access requests continue through consecutive addresses.

Generally, the CPU 102 executes a program by sequentially accessing the external memory 2 with incrementing read addresses unless a step branch takes place. On the other hand, it is quite rare that the CPU 102 repeatedly accesses the same address. Therefore, when the CPU 102 retrieves the data and reserves the data in the latch 1208 at the previous time slot, the remaining 8-bit data set other than that received by the CPU 102 is often hit at the current time slot. In view of this, as a variation of the present embodiment, the latch 1208 may be formed of an 8-bit latch (not 16-bit latch) for reserving only the remaining 8-bit data set which is not accepted by the CPU 102 at the previous time slot. Such an arrangement may not cause trouble as far as the CPU 102 accesses the external memory 2 by incrementing the address. This arrangement is advantageous in that the latch is simplified from the 16-bit form to the 8-bit form.

According to the second aspect of the invention described above, even at the time slot allotted to the tone generator 104, the CPU 102 can obtain desired data in response to the read access request when the desired data is already read out and reserved in the latch. Such a construction can avoid delay of operation of the CPU due to the interruptive access by the tone generator to the external memory.

In the disclosed embodiment, the ratio of the access time between the CPU 102 and the tone generator 104 is set to 3:1 under the state SX=0, or set to 1:1 under the state SX=1. In the former case, the tone generator 104 makes one access per four clocks of ΦCPU. In the latter case, the tone generator 104 makes one access per two clocks. In this embodiment, each 16-bit data retrieved from the external memory 2 contains a pair of 8-bit data sets corresponding to two addresses designated by the CPU 102. Thus, when the CPU 102 successively accesses consecutive addresses, the data reserved in the latch 1208 is efficiently utilized once per two clocks. This period is an exact divisor of an access period of once per four clocks or once per two clocks by which the tone generator 104 accesses the external memory 2. Accordingly, as long as the access by the CPU 102 is consecutive, the data reserved in the latch is continuously hit. Namely, once the data reserved in the latch 1208 is hit, next and further ones of the reserved data are successively hit. Further, as shown in FIGS. 7 and 8, after the wait signal is issued, the reserved data is made hit at next and further time slots as denoted by references 1312 and 1412. In general, the successive hit rate is improved if the number of the data sets contained in one address of the external memory is set to an exact divisor of the access period of the tone generator 104.

Next description is given for a modification of the present embodiment in conjunction with FIG. 6. This modification of the external memory control circuit (MC) has an additional part 1220 indicated by a dotted block with the modified latch 1208 composed of first and second stages of 16-bit structure.

As shown in FIG. 6, the cache controller 1207 controls to selectively write 16-bit data retrieved from the external memory 2 into the first or second stage of the cache latch 1208. Further, the cache controller 1207 controls to selectively transfer the higher or lower order 8-bit set from the first or second stage of the latch 1208 to the selector 1209. Alternatively, the selector 1209 may be connected to the higher and lower 8-bit portions of the data line of the external memory 2, the higher and lower 8-bit portions of the first stage of the latch 1208, and the higher and lower 8-bit portions of the second stage of the latch 1208. Then, the cache controller 1207 may control the selector 1209 to selectively output these inputted 8-bit data.

In this modification, the read net address issued from the CPU bus 110 is inputted into a selector 1221 and an adder 1222. The adder 1222 adds "I" to the inputted net address value, and outputs the added result to the selector 1221. The selector 1221 operates under control by the cache controller 1207 to selectively output the net address as original or the net address as incremented by "1". The output of the selector 1221 is inputted into the selector 1201.

For example as denoted by reference 1313 shown in FIG. 7, the CPU 102 receives a sequence of 8-bit data sets in response to read access requests of consecutive addresses according to the present modification. At the 249-th time slot, the CPU 102 issues a read access request for a higher order 8-bit data set of 16-bit data from a designated address. At this time, the 16-bit data is retrieved from a net address of the designated address of the external memory 2. The higher order 8-bit data set (HB) of the retrieved 16-bit data is instantly fed to the CPU 102, and the retrieved 16-bit data is reserved in the first stage of the cache latch 1208.

Next, at the 250-th time slot, the CPU 102 issues another read access request together with a next address for a lower order 8-bit data set (LB) of the same 16-bit data. At this time, the net address of the next address designated by the CPU 102 is identical with the previous net address latched in the latch 1204 at the 249-th slot. Therefore, it is recognized that the requested data of the current address is already reserved in the first stage of the cache latch 1208. Namely, the cache controller 1207 manages contents of the first and second stages of the cache latch 1208 in correspondence with addresses of the reserved data. To ensure this management, the CPU bus 110 provides each net address information to the cache controller 1207. As consequence, the cache controller 1207 controls the selector 1209 to select the lower order 8-bit data set (LB) stored in the first stage of the latch 1208. The selected LB is fed to the CPU 102.

At the same time, the cache controller 1207 controls the selector 1221 to input the content of the adder 1222 (namely, the next net address incremented by "1" from the current net address) into the address line of the external memory 2 through the selector 1201 at the 250-th time slot which is allotted to the connection between the external memory 2 and the CPU. By this operation, succeeding data at the net address next to the current net address can be retrieved from the external memory 2 in advance. As indicated by reference 1313, such a next address latch is conducted in advance at the 250-th time slot. The 16-bit data retrieved in advance is reserved in the second stage of the cache latch 1208 through the data selector 1202. At the time slot where the advance data retrieval is effected, if the CPU 102 receives the lower order 8-bit data set, it is necessary to detect that the next data to be accessed by the CPU is the one retrieved in advance when the CPU issues a next read access request at a next time slot for the next data from the next address which is subjected to the advance data retrieval. For this purpose, the content of the latch 1204 is updated to the next net address subjected to the advance data retrieval by adding "1" to the current net address latched in the latch 1204.

Next, at the 251-th time slot, the CPU 102 issues another read access request for a higher order 8-bit set of 16-bit data from a next designated address. At this time, the net address of the designated address coincides with the net address latched in the address latch 1204, because the content of the latch 1204 is already updated by incrementing from the previous net address accessed at the 250-th slot to the current net address subjected to the advance access. Thus, it is detected that the requested data is already reserved in advance at the second stage of the cache latch 1208. As consequence, the cache controller 1207 controls the selector 1209 to select the higher order 8-bit data set (HB) reserved in the second stage of the latch 1208. The selected HB is fed to the CPU 102 as the requested data. In parallel to this data transfer, the tone generator 104 accesses the external memory 2 to retrieve therefrom the waveform data at the 251-th slot which is allotted to the tone generator 104.

Then, at the 252-th time slot, the CPU 102 issues a read access request with a next address designation for a lower order 8-bit data set (LB) of the 16-bit data. At this time, the net address of the designated read address coincides with the previous net address reserved in the address latch 1204 so that the requested data must be reserved in the second stage of the cache latch 1208. Thus, the cache controller 1207 controls the output selector 1209 to select the LB reserved in the second stage of the latch 1208. The selected LB is fed to the CPU 102 as the requested data.

At this time, the next 16-bit data is retrieved in advance from the next net address in manner similar to the advance data retrieval at the 250-th slot, since the present 252-th slot is allotted to the connection between the external memory 2 and the CPU. The 16-bit data retrieved in advance is reserved in the first stage of the latch 1208, which is currently vacant. Further, the content of the address latch 1204 is updated to the net address subjected to the advance data retrieval.

At the subsequent 253-th slot, the CPU 102 issues a read access request accompanied by next address designation for a higher order 8-bit data set of the 16-bit data. At this time, the net address of the designated address coincides with the content of the address latch 1204 which is set to the net address subjected to the advance data retrieval. Thus, the requested data must be reserved in advance at the first stage of the cache latch 1208. As consequence, the cache controller 1207 controls the output selector 1209 to select the higher order 8-bit data set from the first stage of the latch 1208 so as to feed the desired HB to the CPU 102.

At the same time, advance data retrieval for a next net address is conducted in similar manner at the 250-th time slot, since the present 253-th slot allows the CPU to access the external memory 2. The 16-bit data retrieved in advance is reserved in the cache latch 1208 at the second stage which is currently vacant. At this time slot, the CPU 102 receives the higher order 8-bit data set. In such a case, the received higher order 8-bit data set must be the one previously retrieved by the advance data retrieval. At the next time slot, the CPU 102 may request the lower order 8-bit data set of the same 16-bit data previously retrieved by the advance data retrieval. Further, at the next 254-th slot, the CPU 102 may request a higher order 8-bit data set of the next 16-bit data which is retrieved in advance at the present 253-th slot if the CPU 102 successively issues read access requests for consecutive addresses. In view of this, the current net address stored in the address latch 1204 is held as it is without increment. By this, when the CPU issues a subsequent read access request with the next address designation, at the next 254-th slot, it can be well detected that the requested data is already read out in advance.

Then, at the 254-th time slot, the CPU 102 actually issues the read access request with the next address designation for a lower order 8-bit data set of the 16-bit data. At this time, the net address value of the currently designated read address coincides with the previous net address value stored in the address latch 1204. It is confirmed that the requested data is already reserved in the first stage of the cache latch 1208. Thus, the cache controller 1207 controls the selector 1209 to select the lower order 8-bit data set (LB) reserved in the first stage of the latch 1208. The selected LB is fed to the CPU 102 as the requested data. At this time slot, the LB previously latched in the first stage of the latch 1208 by the advance data retrieval is fed to the CPU 102. The CPU 102 may request a next 8-bit data set which must be the one reserved in the second stage of the latch 1208 by the last advance data retrieval. In view of this, the content of the address latch 1204 is updated by increment to the net address corresponding to the data reserved in the second stage of the latch 1208.

At the subsequent 255-th time slot, the CPU 102 issues a read access request accompanied by next address designation for a higher order 8-bit data set (HB) of the 16-bit data. At this time, the net address value of the designated address coincides with the content of the address latch 1204, which is not the previous net address but the updated net address subjected to the last advance data retrieval. Thus, it is confirmed that the currently requested HB is already reserved in the second stage of the cache latch 1208. Thus, the cache controller 1207 controls the output selector 1209 to select the HB stored in the second stage of the latch 1208. The selected HB is fed to the CPU 102 as the requested data. In parallel to this data caching, the tone generator 104 accesses the external memory 2 to retrieve therefrom the waveform data at this 255-th time slot. By such a manner, the CPU can almost continuously access the external memory without waiting as long as the CPU issues read access requests for consecutive addresses.

The above described embodiment may be modified to eliminate the latch 1204 and the comparator 1205, while the cache controller 1207 works in place of the eliminated components. Namely, the cache controller 1207 manages the addresses of the data reserved in the first and second stages of the cache latch 1208. The cache controller 1207 controls the data caching based on the addresses designated by the CPU 102 and the addresses managed by the cache controller 1207.

As described above, according to the second aspect of the invention, the operation speed of the CPU may not be affected by the interruptive access to the external memory by the tone generator in the sound source chip which integrates therein the CPU and the tone generator.

FIG. 9 shows an additional embodiment of the inventive musical sound source apparatus. This embodiment has basically the same construction as the first embodiment shown in FIG. 1. The same components are denoted by the same references as those of the first embodiment to facilitate better understanding of the additional embodiment. The storage such as ROM 2 and RAM 108 can store various data such as waveform data and various programs including the system control program or basic program, the waveform reading program and other application programs. Normally, the ROM 2 provisionally stores these programs. However, if not, any program may be loaded into the apparatus. The loaded program is transferred to the RAM 108 to enable the CPU 102 to operate the inventive system of the musical sound source apparatus. By such a manner, new or version-up programs can be readily installed in the system. For this purpose, a machine-readable media such as a CD-ROM (Compact Disc Read Only Memory) 151 is utilized to install the program. The CD-ROM 151 is set into a CD-ROM drive 152 to read out and download the program from the CD-ROM 151 into the RAM 108 through the bus 110. The machine-readable media may be composed of a magnetic disk or an optical disk other than the CD-ROM 151.

A communication interface 153 is connected to an external server computer 154 through a communication network 155 such as LAN (Local Area Network), public telephone network and INTERNET. If an internal storage does not reserve needed data or program, the communication interface 153 is activated to receive the data or program from the server computer 154. The CPU 103 transmits a request to the server computer 154 through the interface 153 and the network 155. In response to the request, the server computer 154 transmits the requested data or program to the apparatus. The transmitted data or program is stored in the internal storage to thereby complete downloading.

The inventive musical sound source apparatus can be implemented by a personal computer which is installed with the needed data and programs. In such a case, the data and programs are provided to the user by means of the machine-readable media such as the CD-ROM 151 or a floppy disk. The machine-readable media contains instructions for causing the personal computer to perform the inventive musical tone generating method as described in conjunction with the previous embodiments.

Namely, in the inventive sound source apparatus shown in FIG. 9, the central processing unit 102 is integrated in the semiconductor chip 1 and is operative in response to the primary operating clock signal ΦCPU for creating a control message. The tone generating unit 104 is integrated in the same semiconductor chip 1 and is operative in response to the secondary operating clock signal ΦTG for generating a musical tone according to the control message. The master clock means is provided in the form of the quartz oscillator 8 for generating the master clock signal having a desired frequency selected from a plurality of frequencies. The designating means is provided in the form of the mode changer 9 for designating one of a first mode and a second mode corresponding to different operating speeds. The clock generating means is provided in the form of the clock generator 109 for variably frequency-dividing the master clock signal to generate the primary operating clock signal ΦCPU and the secondary operating clock signal ΦTG. The clock generating means 109 is responsive to the designating means 9 for changing a frequency ratio of the primary operating clock signal ΦCPU to the secondary operating clock signal ΦTG between the first mode and the second mode.

The sound source apparatus further includes the external memory 2 provided separately from the semiconductor chip 1 for storing information required for generation of the musical tone, allotting means in the form of the memory controller 103 for allotting a primary time slot to the central processing unit 102 and a secondary time slot to the tone generating unit 104, and control means also in the form of the memory controller 103 for selectively connecting the external memory 2 to the central processing unit 102 at the primary time slot so that the central processing unit 102 can access the external memory 2 to retrieve therefrom one share of the information in response to the primary operating clock signal ΦCPU so as to create the control message and for selectively connecting the external memory 2 to the tone generating unit 104 at the secondary time slot so that the tone generating unit 104 can access the external memory 2 to retrieve therefrom another share of the information in response to the secondary operating clock signal ΦTG so as to generate the musical tone. The control means 103 is responsive to the designating means 9 for changing a volume ratio of said one share allotted to the central processing unit 102 relative to said another share allotted to the tone generating unit 104.

From a view of the second aspect of the invention, in the sound source apparatus, the tone generating unit 104 is integrated in the semiconductor chip 1 for successively issuing an access request for a desired sample of waveform data so as to generate a musical tone. The central processing unit 102 is integrated in the same semiconductor chip 1 for successively issuing another access request for a desired item of control data so as to control the tone generating unit 104. The external memory 2 is provided separately from the semiconductor chip 1 for storing the waveform data and the control data such that a plurality of items of the control data are located in one address of the external memory 2. The allotting means of the memory controller 103 allots a time slot to enable the tone generating unit 104 to access the external memory 2 to retrieve therefrom the desired sample of the waveform data in response to the access request, and allots another time slot to enable the central processing unit 102 to access the external memory 2 to retrieve a plurality of items of the control data including the desired item from one address of the external memory 2 in response to preceding one of the access request. The cache memory is provided in the semiconductor chip 1 in the form of the cache latch 1208 for temporarily reserving the plurality of the items of the control data which are retrieved from the external memory 2. The caching means in the form of the cache controller 1207 is operative in response to a succeeding access request issued by the central processing unit 102 during the time slot allotted to the tone generating unit 104 for transferring the desired item of the control data to the central processing unit 102 from the cache memory if the desired item is contained in the plurality of the items temporarily reserved in the cache memory 1208. The cache memory 1208 has means for temporarily reserving a next plurality of items of the control data which are retrieved in advance from the external memory 2 during a current time slot allotted to the central processing unit 102 while a current desired item of the control data is provided to the central processing unit 102 from the cache memory 1208. The caching means 1207 includes means operative during a next time slot allotted to the central processing unit 102 for transferring thereto a next desired item of the control data from the cache memory 1208 if the next desired item is contained in the next plurality of the items of the control data which are already reserved in the cache memory 1208.

What is claimed is:

1. A sound source apparatus comprising:
   a central processing unit integrated in a semiconductor chip and being operative in response to a primary operating clock signal for creating a control message;
   a tone generating unit integrated in the same semiconductor chip and being operative in response to a secondary operating clock signal for generating a musical tone according to the control message;
   master clock means for generating a master clock signal having a desired frequency selected from a plurality of frequencies;
   designating means for designating one of a first mode and a second mode corresponding to different operating speeds; and
   clock generating means for variably frequency-dividing the master clock signal to generate the primary operating clock signal and the secondary operating clock signal, the clock generating means being responsive to the designating means for changing a frequency ratio of the primary operating clock signal to the secondary operating clock signal between the first mode and the second mode.

2. A sound source apparatus according to claim 1, wherein the designating means designates the first mode when the master clock signal has a first frequency and designates the second mode when the master clock signal has a second frequency,
   wherein said first frequency is high relative to said second frequency, and
   wherein the clock generating means operates under the second mode for decreasing the frequency ratio of the primary operating clock signal to the secondary operating clock signal as compared to the first mode.

3. A sound source apparatus according to claim 1, wherein the designating means automatically switches between the first mode and the second mode according to an operating state of the central processing unit and the tone generating unit so as to prevent degradation of a quality of the musical tone.

4. A sound source apparatus according to claim 1, further comprising an external memory provided separately from the semiconductor chip for storing information required for generation of the musical tone, allotting means for allotting a primary time slot to the central processing unit and a secondary time slot to the tone generating unit, and control means for selectively connecting the external memory to the central processing unit at the primary time slot so that the central processing unit can access the external memory to retrieve therefrom one share of the information in response to the primary operating clock signal so as to create the control message and for selectively connecting the external memory to the tone generating unit at the secondary time slot so that the tone generating unit can access the external memory to retrieve therefrom another share of the information in response to the secondary operating clock signal so as to generate the musical tone, wherein the control means is responsive to the designating means for changing a volume ratio of said one share allotted to the central processing unit relative to said another share allotted to the tone generating unit.

5. A sound source apparatus according to claim 4, wherein the control means changes the volume ratio of said one share relative to said another share in terms of an access cycle of the central processing unit within the primary time slot and another access cycle of the tone generating unit within the secondary time slot.

6. A sound source apparatus according to claim 4, wherein the control means changes the volume ratio of said one share relative to said another share in terms of a length of the primary time slot and another length of the secondary time slot.

7. A sound source apparatus according to claim 4, wherein the designating means designates the first mode when the master clock signal has a first frequency and designates the second mode when the master clock signal has a second frequency,
   wherein said first frequency is high relative to said second frequency, and
   wherein the control means operates under the second mode for decreasing the volume ratio of said one share relative to said another share as compared to the first mode.

8. A sound source apparatus comprising:
   an external memory for storing waveform data and control data such that a plurality of items of the control data are located in one address of the external memory;
   a tone generating unit integrated in a semiconductor chip provided separately from said external memory for successively issuing an access request for a desired sample of the waveform data so as to generate a musical tone;
   a central processing unit integrated in the same semiconductor chip for successively issuing another access request for a desired item of the control data so as to control the tone generating unit;
   allotting means for allotting a time slot to enable the tone generating unit to access the external memory to retrieve therefrom the desired sample of the waveform data in response to the access request and for allotting another time slot to enable the central processing unit to access the external memory to retrieve a plurality of items of the control data including the desired item from one address of the external memory in response to a preceding access request;
   a cache memory provided in the semiconductor chip for temporarily reserving the plurality of the items of the control data which are retrieved from the external memory; and
   caching means operative in response to a succeeding access request issued by the central processing unit during the time slot allotted to the tone generating unit for transferring the desired item of the control data to the central processing unit from the cache memory if the desired item is contained in the plurality of the items temporarily reserved in the cache memory.

9. A sound source apparatus according to claim 8, wherein the cache memory has means for temporarily reserving a next plurality of items of the control data which are retrieved in advance from the external memory during a current time slot allotted to the central processing unit while a current desired item of the control data is provided to the central processing unit from the cache memory, and wherein the caching means includes means operative during a next time slot allotted to the central processing unit for transferring thereto a next desired item of the control data from the cache memory if the next desired item is contained in the next plurality of the items of the control data which are already reserved in the cache memory.

10. A method of generating a musical tone comprising the steps of:
operating a central processing unit integrated in a semiconductor chip in response to a primary operating clock signal for creating a control message;
operating a tone generating unit integrated in the same semiconductor chip in response to a secondary operating clock signal for generating a musical tone according to the control message;
generating a master clock signal having a desired frequency selected from a plurality of frequencies;
designating one of a first mode and a second mode corresponding to different operating speeds; and
variably frequency-dividing the master clock signal to generate the primary operating clock signal and the secondary operating clock signal so as to change a frequency ratio of the primary operating clock signal to the secondary operating clock signal between the first mode and the second mode.

11. A method according to claim 10, wherein the step of designating designates the first mode when the master clock signal has a first frequency and designates the second mode when the master clock signal has a second frequency, and the step of variably frequency-dividing is performed under the second mode for decreasing the frequency ratio of the primary operating clock signal to the secondary operating clock signal as compared to the first modes
wherein said first frequency is high relative to said second frequency.

12. A method according to claim 10, wherein the step of designating automatically switches between the first mode and the second mode according to an operating state of the central processing unit and the tone generating unit so as to prevent degradation of a quality of the musical tone.

13. A method according to claim 10 further comprising the steps of:
storing information required for generation of the musical tone in an external memory provided separately from the semiconductor chip,
allotting a primary time slot to the central processing unit and a secondary time slot to the tone generating unit,
selectively connecting the external memory to the central processing unit at the primary time slot so that the central processing unit can access the external memory to retrieve therefrom one share of the information in response to the primary operating clock signal so as to create the control message, and selectively connecting the external memory to the tone generating unit at the secondary time slot so that the tone generating unit can access the external memory to retrieve therefrom another share of the information in response to the secondary operating clock signal so as to generate the musical tone,
wherein a volume ratio of said one share allotted to the central processing unit is changed relative to said another share allotted to the tone generating unit according to the designated one of the first mode and the second mode.

14. A method according to claim 13, wherein the volume ratio of said one share relative to said another share is changed in terms of an access cycle of the central processing unit within the primary time slot and another access cycle of the tone generating unit within the secondary time slot.

15. A method according to claim 13, wherein the volume ratio of said one share relative to said another share is changed in terms of a length of the primary time slot and another length of the secondary time slot.

16. A method according to claim 13, wherein the step of designating designates the first mode when the master clock signal has a first frequency and designates the second mode when the master clock signal has a second frequency,
wherein said first frequency is high relative to said second frequency, and
wherein under the second mode the volume ratio of said one share relative to said another share is decreased as compared to the first mode.

17. A method of generating a musical tone comprising the steps of:
storing waveform data and control data in an external memory such that a plurality of items of the control data are located in one address of the external memory;
operating a tone generating unit integrated in a semiconductor chip, provided separately from said external memory, for successively issuing an access request for a desired sample of the waveform data so as to generate a musical tone;
operating a central processing unit integrated in the same semiconductor chip for successively issuing another access request for a desired item of the control data so as to control the tone generating unit;
allotting a time slot to enable the tone generating unit to access the external memory to retrieve therefrom the desired sample of the waveform data in response to the access request and also allotting another time slot to enable the central processing unit to access the external memory to retrieve a plurality of items of the control data including the desired item from one address of the external memory in response to a preceding access request;
temporarily reserving, in a cache memory provided in the semiconductor chips the plurality of the items of the control data which are retrieved from the external memory; and
caching in response to a succeeding access request issued by the central processing unit during the time slot allotted to the tone generating unit for transferring the desired item of the control data to the central processing unit from the cache memory if the desired item is contained in the plurality of the items temporarily reserved in the cache memory.

18. A method according to claim 17, wherein the cache memory temporarily reserves a next plurality of items of the control data which are retrieved in advance from the external memory during a current time slot allotted to the central processing unit while a current desired item of the control data is provided to the central processing unit from the cache memory, and wherein the step of caching is effected during a next time slot allotted to the central processing unit for transferring thereto a next desired item of the control data from the cache memory if the next desired item is contained in the next plurality of the items of the control data which are already reserved in the cache memory.

19. A machine-readable media containing a group of instructions for causing a sound source, apparatus to perform a method of generating a musical tone comprising the steps of:

operating a central processing unit integrated in a semiconductor chip in response to a primary operating clock signal for creating a control message;

operating a tone generating unit integrated in the same semiconductor chip in response to a secondary operating clock signal for generating a musical tone according to the control message;

generating a master clock signal having a desired frequency selected from a plurality of frequencies;

designating one of a first mode and a second mode corresponding to different operating speeds; and variably frequency-dividing the master clock signal to generate the primary operating clock signal and the secondary operating clock signal so as to change a frequency ratio of the primary operating clock signal to the secondary operating clock signal between the first mode and the second mode.

20. The machine-readable media according to claim 19, wherein the step of designating designates the first mode when the master clock signal has a first frequency and designates the second mode when the master clock signal has a second frequency, and the step of variably frequency-dividing is performed under the second mode for decreasing the frequency ratio of the primary operating clock signal to the secondary operating clock signal as compared to the first mode, wherein said first frequency is high relative to said second frequency.

21. The machine-readable media according to claim 19, wherein the step of designating automatically switches between the first mode and the second mode according to an operating state of the central processing unit and the tone generating unit so as to prevent degradation of a quality of the musical tone.

22. The machine-readable media according to claim 19, further comprising the steps of:

storing information required for generation of the musical tone in an external memory provided separately from the semiconductor chip, allotting a primary time slot to the central processing unit and a secondary time slot to the tone generating unit, and selectively connecting the external memory to the central processing unit at the primary time slot so that the central processing unit can access the external memory to retrieve therefrom one share of the information in response to the primary operating clock signal so as to create the control message and selectively connecting the external memory to the tone generating unit at the secondary time slot so that the tone generating unit can access the external memory to retrieve therefrom another share of the information in response to the secondary operating clock signal so as to generate the musical tone, wherein a volume ratio of said one share allotted to the central processing unit is changed relative to said another share allotted to the tone generating unit according to the designated one of the first mode and the second mode.

23. The machine-readable media according to claim 22, wherein the volume ratio of said one share relative to said another share is changed in terms of an access cycle of the central processing unit within the primary time slot and another access cycle of the tone generating unit within the secondary time slot.

24. The machine-readable media according to claim 22, wherein the volume ratio of said one share relative to said another share is changed in terms of a length of the primary time slot and another length of the secondary time slot.

25. The machine-readable media according to claim 22, wherein the step of designating designates the first mode when the master clock signal has a first frequency and designates the second mode when the master clock signal has a second frequency, wherein said first frequency is high relative to said second frequency, and wherein under the second mode the volume ratio of said one share relative to said another share is decreased as compared to the first mode.

26. A machine-readable media containing program instructions for causing a sound source apparatus to perform a method of generating a musical tone comprising the steps of:

storing waveform data and control data in an external memory such that a plurality of items of the control data is located in one address of the external memory;

operating a tone generating unit integrated in a semiconductor chip, provided separately from the external memory, for successively issuing an access request for a desired sample of the waveform data so as to generate a musical tone;

operating a central processing unit integrated in the same semiconductor chip for successively issuing another access request for a desired item of the control data so as to control the tone generating unit;

allotting a time slot to enable the tone generating unit to access the external memory to retrieve therefrom the desired sample of the waveform data in response to the access request and also allotting another time slot to enable the central processing unit to access the external memory to retrieve a plurality of items of the control data including the desired item from one address of the external memory in response to a preceding access request;

temporarily reserving, in a cache memory provided in the semiconductor chips the plurality of the items of the control data which are retrieved from the external memory; and caching in response to a succeeding access request issued by the central processing unit during the time slot allotted to the tone generating unit for transferring the desired item of the control data to the central processing unit from the cache memory if the desired item is contained in the plurality of the items temporarily reserved in the cache memory.

27. The machine-readable media according to claim 26, wherein the cache memory temporarily reserves a next plurality of items of the control data which are retrieved in advance from the external memory during a current time slot allotted to the central processing unit while a current desired item of the control data is provided to the central processing unit from the cache memory, and wherein the step of caching is effected during a next time slot allotted to the central processing unit for transferring thereto a next desired item of the control data from the cache memory if the next desired item is contained in the next plurality of the items of the control data which are already reserved in the cache memory.

* * * * *